US010679995B2

(12) United States Patent
Wang et al.

(10) Patent No.: US 10,679,995 B2
(45) Date of Patent: Jun. 9, 2020

(54) SEMICONDUCTOR DEVICE AND METHOD

(71) Applicant: Taiwan Semiconductor Manufacturing Company, Ltd., Hsinchu (TW)

(72) Inventors: Chun-Chieh Wang, Kaohsiung (TW); Yueh-Ching Pai, Taichung (TW); Huai-Tei Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/276,143

(22) Filed: Feb. 14, 2019

(65) Prior Publication Data

US 2020/0043927 A1     Feb. 6, 2020

Related U.S. Application Data

(60) Provisional application No. 62/712,504, filed on Jul. 31, 2018.

(51) Int. Cl.
*H01L 29/66*        (2006.01)
*H01L 27/092*      (2006.01)
(Continued)

(52) U.S. Cl.
CPC ...... *H01L 27/0924* (2013.01); *H01L 21/0206* (2013.01); *H01L 21/02211* (2013.01); *H01L 21/02271* (2013.01); *H01L 21/02532* (2013.01); *H01L 21/3065* (2013.01); *H01L 21/30625* (2013.01); *H01L 21/76224* (2013.01); *H01L 21/823807* (2013.01); *H01L 21/823821* (2013.01); *H01L 21/823828* (2013.01); *H01L 21/823878* (2013.01); *H01L 21/823892* (2013.01); *H01L 27/0928* (2013.01); *H01L 29/0847* (2013.01); *H01L 29/1054* (2013.01);
(Continued)

(58) Field of Classification Search
CPC ........... H01L 21/0206; H01L 21/02211; H01L 21/02271; H01L 27/0924; H01L 29/0847
USPC ....................................................... 257/192
See application file for complete search history.

(56) References Cited

U.S. PATENT DOCUMENTS 8,796,666 B1 *   8/2014   Huang .............. H01L 29/66795
                                                                             257/18
8,815,712 B2     8/2014   Wan et al.
(Continued)

*Primary Examiner* — Tan N Tran
(74) *Attorney, Agent, or Firm* — Slater Matsil, LLP

(57) ABSTRACT

A semiconductor device including a cap layer and a method for forming the same are disclosed. In an embodiment, a method includes epitaxially growing a first semiconductor layer over an N-well; etching the first semiconductor layer to form a first recess; epitaxially growing a second semiconductor layer filling the first recess; etching the second semiconductor layer, the first semiconductor layer, and the N-well to form a first fin; forming a shallow trench isolation region adjacent the first fin; and forming a cap layer over the first fin, the cap layer contacting the second semiconductor layer, forming the cap layer including performing a pre-clean process to remove a native oxide from exposed surfaces of the second semiconductor layer; performing a sublimation process to produce a first precursor; and performing a deposition process wherein material from the first precursor is deposited on the second semiconductor layer to form the cap layer.

20 Claims, 33 Drawing Sheets

(51) Int. Cl.
*H01L 21/02* (2006.01)
*H01L 21/3065* (2006.01)
*H01L 21/8238* (2006.01)
*H01L 21/306* (2006.01)
*H01L 29/165* (2006.01)
*H01L 29/10* (2006.01)
*H01L 29/08* (2006.01)
*H01L 21/762* (2006.01)
*H01L 21/308* (2006.01)
*H01L 21/265* (2006.01)
*H01L 21/027* (2006.01)

(52) U.S. Cl.
CPC ........ *H01L 29/165* (2013.01); *H01L 29/6656* (2013.01); *H01L 29/66545* (2013.01); *H01L 29/66636* (2013.01); *H01L 21/0273* (2013.01); *H01L 21/26513* (2013.01); *H01L 21/3081* (2013.01); *H01L 21/3086* (2013.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |

* cited by examiner

SEMICONDUCTOR DEVICE AND METHOD

PRIORITY CLAIM AND CROSS-REFERENCE

This application claims the benefit of U.S. Provisional Application No. 62/712,504, filed on Jul. 31, 2018, entitled "Semiconductor Device and Method of Manufacture," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
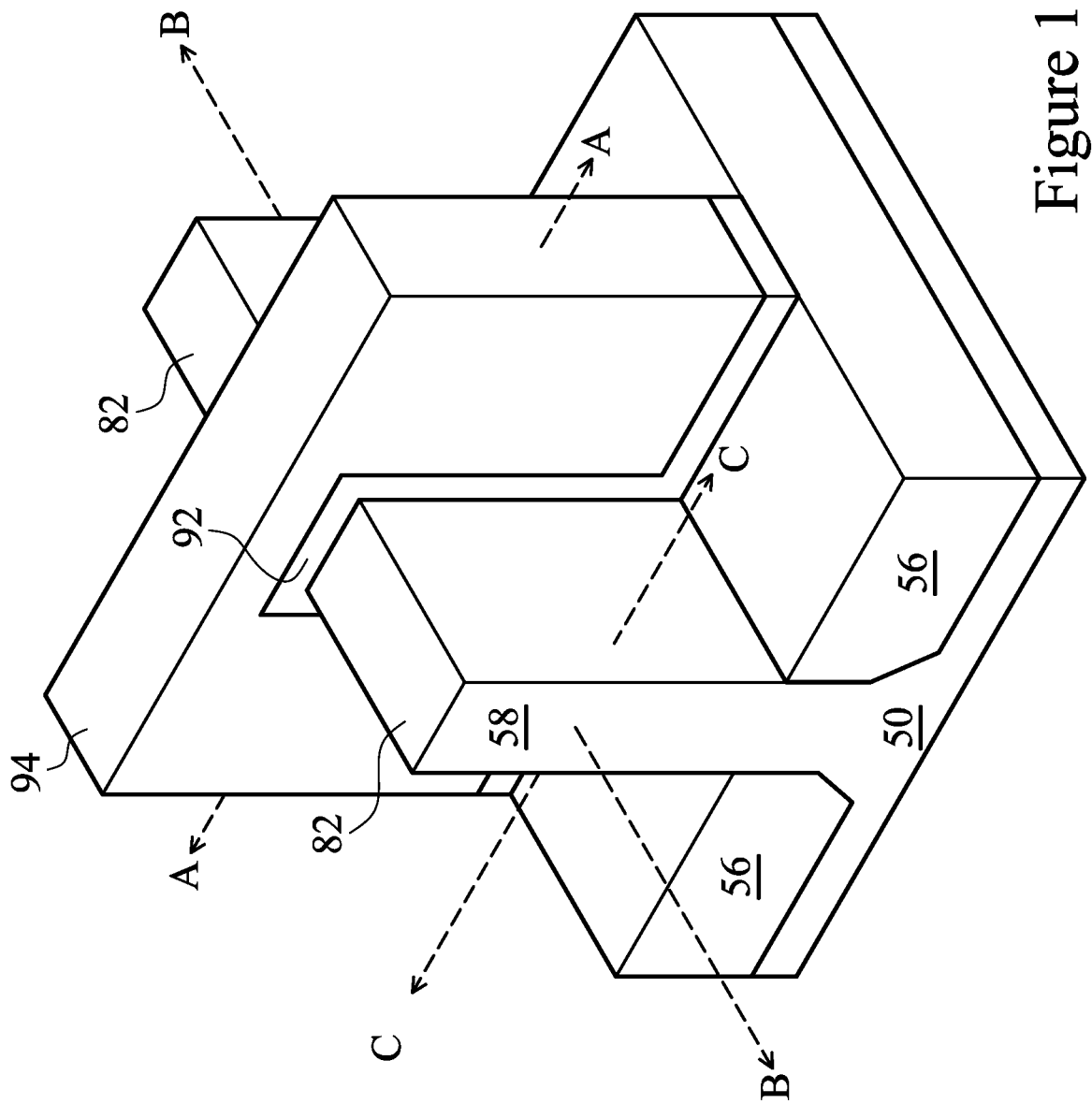
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved semiconductor fins. For example, a silicon cap layer may be formed over a semiconductor fin formed at least partially of silicon germanium. The semiconductor fin may be on an N-well and may include a portion of the N-well. The cap layer may be formed using a low-temperature process such that out-diffusion of germanium from the semiconductor fin is limited. Specifically, the low-temperature process may include a pre-clean process, a sublimation process, a deposition process, and a cooling process performed in situ (e.g., in the same position or in the same semiconductor processing chamber) in a furnace.

The resulting p-type semiconductor fin may have reduced wiggle effect (e.g., less bending or warping along the length of the p-type semiconductor fin), better line-edge roughness, improved drain-induced barrier loading (DIBL), low channel resistance, and reduced variation in threshold voltage. Furthermore, the semiconductor fin may be formed without small wings (e.g., triangular protrusions extending from sidewalls of the semiconductor fin) being formed. As such, semiconductor devices including semiconductor fins formed by these processes may have improved device performance.

FIG. 1 illustrates an example of a FinFET in a three-dimensional view for reference, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described and illustrated as being separate from the substrate 50, as used herein the term "substrate" may be used to refer to just the semiconductor substrate or a semiconductor substrate inclusive of the isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to the cross-section A-A and is along a longitudinal axis of the fin 58 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 21B are cross-sectional views of intermediate stages in the manufacturing of FinFETs, in accordance with some embodiments. FIGS. 2 through 11B illustrate reference cross-section A-A illustrated in FIG. 1, except for multiple fins/FinFETs. In FIGS. 12A through 21B, figures ending with an "A" designation are illustrated along reference cross-section A-A illustrated in FIG. 1, except for multiple fins/FinFETs, and figures ending with a "B" designation are illustrated along a similar cross-section B-B illustrated in FIG. 1. FIGS. 15C and 15D are illustrated along reference cross-section C-C illustrated in FIG. 1.

Figure 2:
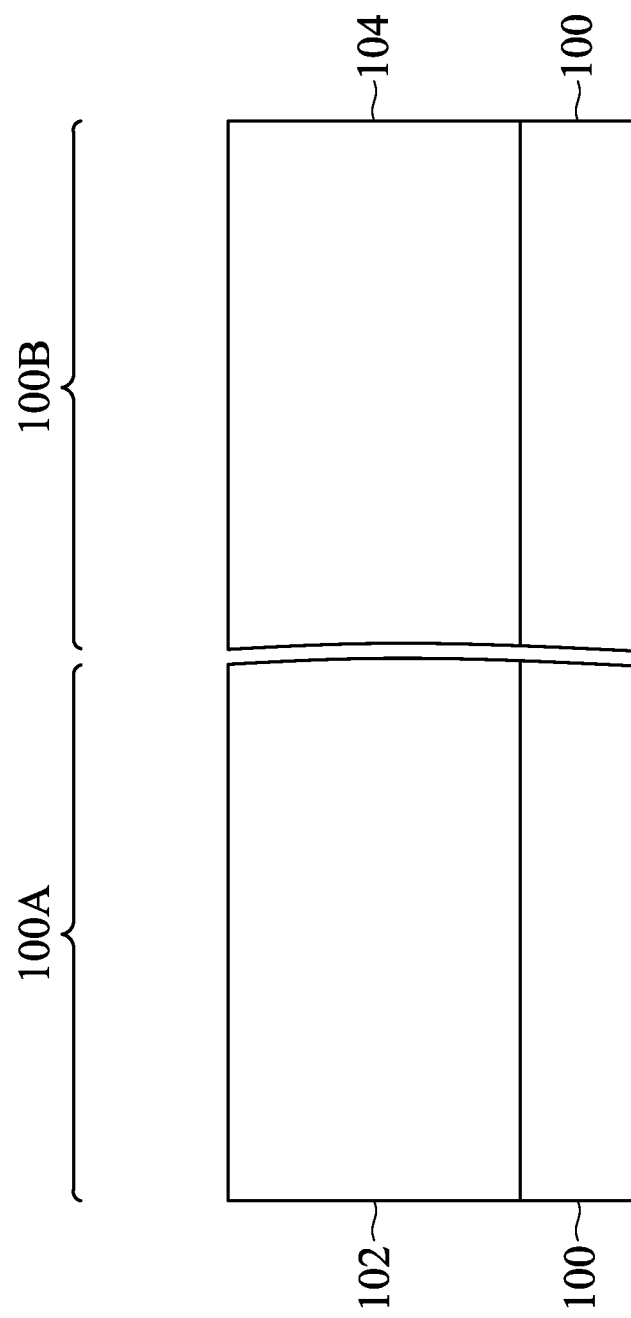
FIG. 2 illustrates a cross-sectional view of an N-well and a P-well over a substrate, in accordance with some embodiments.

In FIG. 2, a substrate 100 having an n-well region 102 and a p-well region 104 formed therein is provided. The substrate 100 may be a semiconductor substrate, such as a bulk semiconductor, a semiconductor-on-insulator (SOI) substrate, or the like, which may be doped (e.g., with a p-type dopant or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AnnAs, AlGaAs, GaInAs, GaInP, and/or GaInAsP; or combinations thereof.

The substrate 100 has a first region 100A and a second region 100B. The first region 100A may be for forming p-type devices, such as PMOS transistors, e.g., p-type Fin-FETs. The second region 100B may be for forming n-type devices, such as NMOS transistors, e.g., n-type FinFETs. The first region 100A may be physically separated from the second region 100B (as illustrated by a divider), and any number of device features (e.g., other active devices, doped regions, isolation structures, etc.) may be disposed between the first region 100A and the second region 100B.

The n-well region 102 may be formed in the substrate 100 by covering the p-well region 104 with a mask (such as a photoresist, an oxide, or the like) and performing an ion implantation process on the n-well region 102. N-type dopants, such as arsenic ions, may be implanted into the n-well region 102. The p-well region 104 may be formed in the substrate 100 by covering the n-well region 102 with a mask (such as a photoresist, an oxide, or the like) and performing an ion implantation process on the p-well region 104. P-type dopants, such as boron ions, may be implanted into the p-well region 104. In some embodiments, the n-well region 102 may comprise n-type doped silicon and the p-well region 104 may comprise p-type doped silicon.

Figure 3:
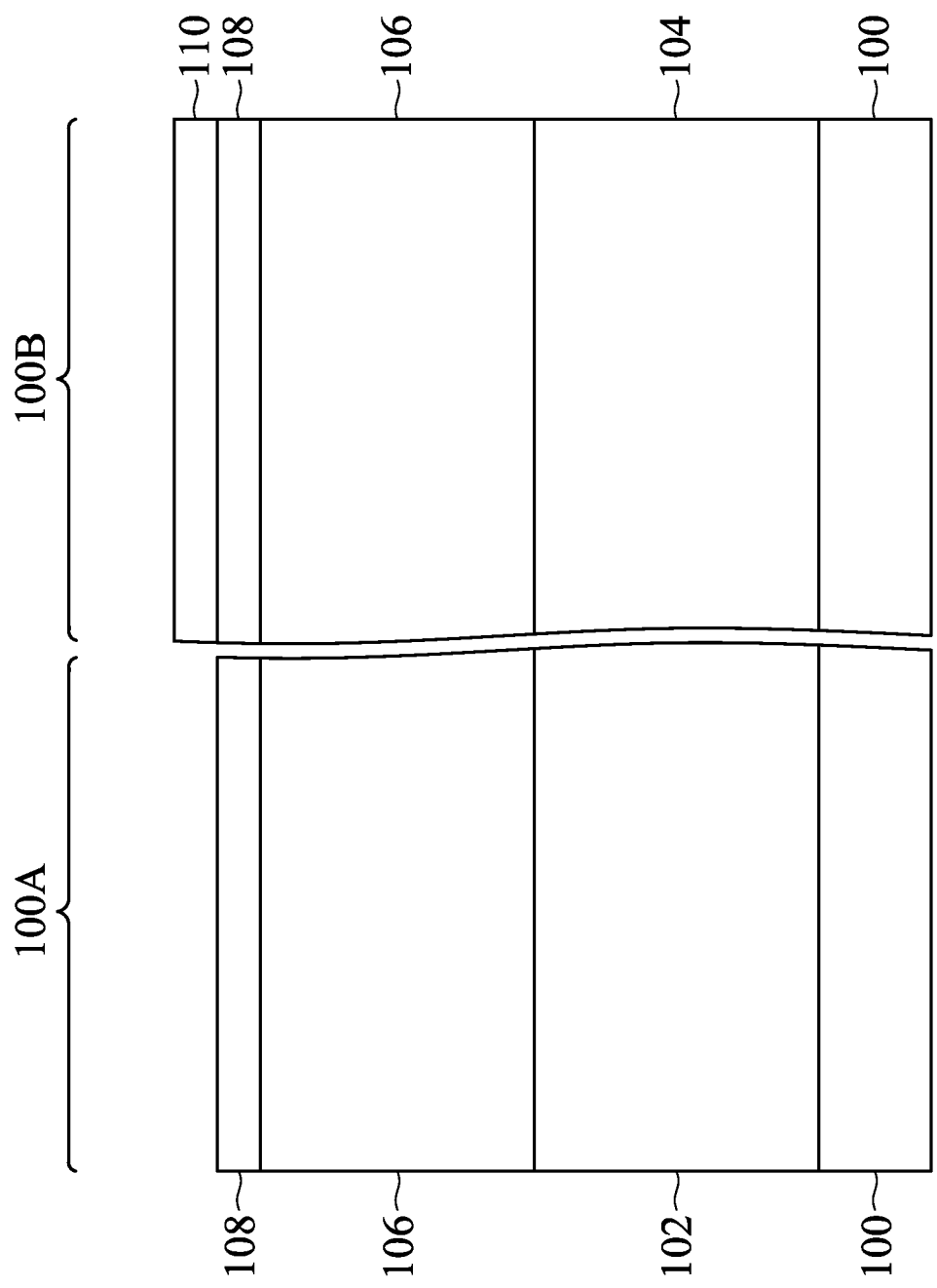
FIG. 3 illustrates a cross-sectional view of a formation of a first epitaxial layer, a mask layer, and a patterned photoresist, in accordance with some embodiments.

In FIG. 3, a first epitaxial layer 106 is formed over the n-well region 102 and the p-well region 104, a mask layer 108 is formed over the first epitaxial layer 106, and a patterned photoresist 110 is formed on the mask layer 108. The first epitaxial layer 106 may be a channel in a subsequently formed NMOS device and may be used to reduce dislocation defects in a subsequently formed second epitaxial layer 114. The first epitaxial layer 106 may be formed by a process such as epitaxial growth or the like. The first epitaxial layer 106 may comprise a material such as silicon (e.g., single-crystalline/monocrystalline silicon) or the like. The first epitaxial layer 106 may have a lattice constant similar to or the same as the lattice constants of the n-well region 102 and the p-well region 104. As explained in greater detail below, the first epitaxial layer 106 will be patterned to form a fin in the second region 100B (e.g., for NMOS devices) and will be used as a seed layer to form another epitaxial layer in the first region 100A (e.g., for PMOS devices). In some embodiments, the first epitaxial layer 106 has a thickness of between about 1 Å and about 300 Å.

The mask layer 108 may be formed by a process such as chemical vapor deposition (CVD), atomic layer deposition (ALD), or the like. The mask layer 108 may comprise a material such as silicon dioxide, silicon nitride, or the like. The patterned photoresist 110 may be deposited using a spin-on technique or the like and patterned by exposing the photoresist material to a patterned energy source (e.g., a patterned light source, an electron beam (e-beam) source, or the like) and exposing the patterned photoresist material to a developer solution. The developer solution may remove a portion of the photoresist material such that at least a portion of the mask layer 108 is exposed. As illustrated in FIG. 3, the patterned photoresist 110 may be patterned such that the patterned photoresist 110 extends over the p-well region 104 without extending over the n-well region 102. However, in various other embodiments, the patterned photoresist 110 may overlap at least a portion of the n-well region 102 or may not completely cover the p-well region 104.

Figure 4:
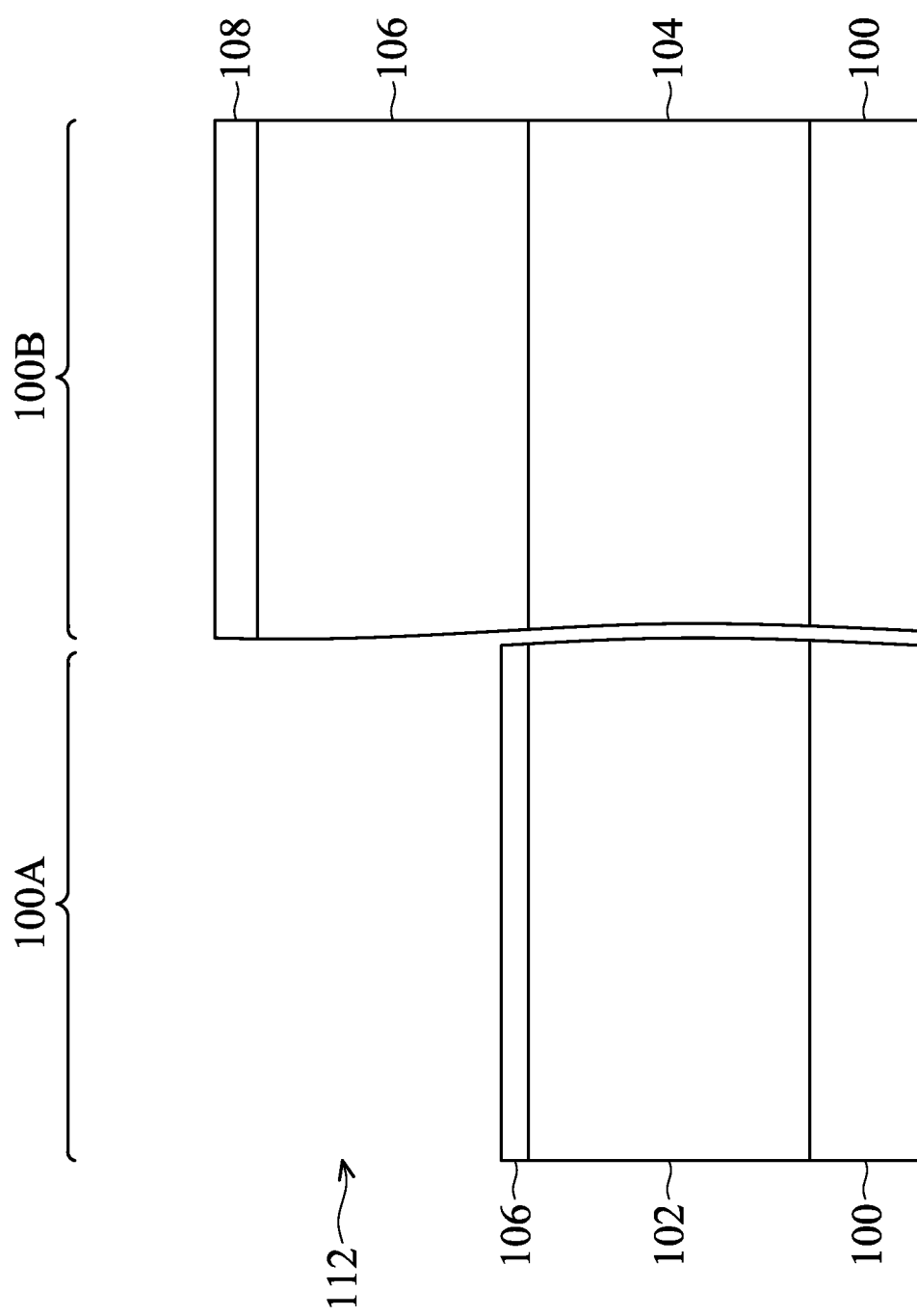
FIG. 4 illustrates a cross-sectional view of a formation of a first opening, in accordance with some embodiments.

In FIG. 4, the mask layer 108 is etched using the patterned photoresist 110 as a mask and the first epitaxial layer 106 is etched using the mask layer 108 as a mask to form a first opening 112. The mask layer 108 and the first epitaxial layer 106 may be etched by suitable etch processes, such as anisotropic etch processes. In some embodiments, the mask layer 108 and the first epitaxial layer 106 may be etched by dry etch processes such as reactive-ion etching (RIE), neutral-beam etching (NBE), combinations thereof, or the like. After the mask layer 108 is etched, the patterned photoresist 110 may be removed using suitable photoresist stripping techniques, such as chemical solvent cleaning, plasma ashing, dry stripping and/or the like. The patterned photoresist 110 may be removed before or after etching the first epitaxial layer 106. As illustrated in FIG. 4, the first opening 112 may be formed over the n-well region 102, without extending over the p-well region 104. However, in some embodiments, the first opening 112 may extend over at least a portion of the p-well region 104. As illustrated in FIG. 4, at least a portion of the first epitaxial layer 106 may remain below the first opening 112. The portion of the first epitaxial layer 106 remaining over the n-well region 102 may be used to grow a second epitaxial layer 114, discussed below in reference to FIG. 5. In some embodiments, the portion of the first epitaxial layer 106 remaining may have a thickness of between about 1 Å and about 299 Å after etching the first opening 112. In some embodiments, a depth of the first opening 112 is between about 1 Å and about 299 Å.

Figure 5:
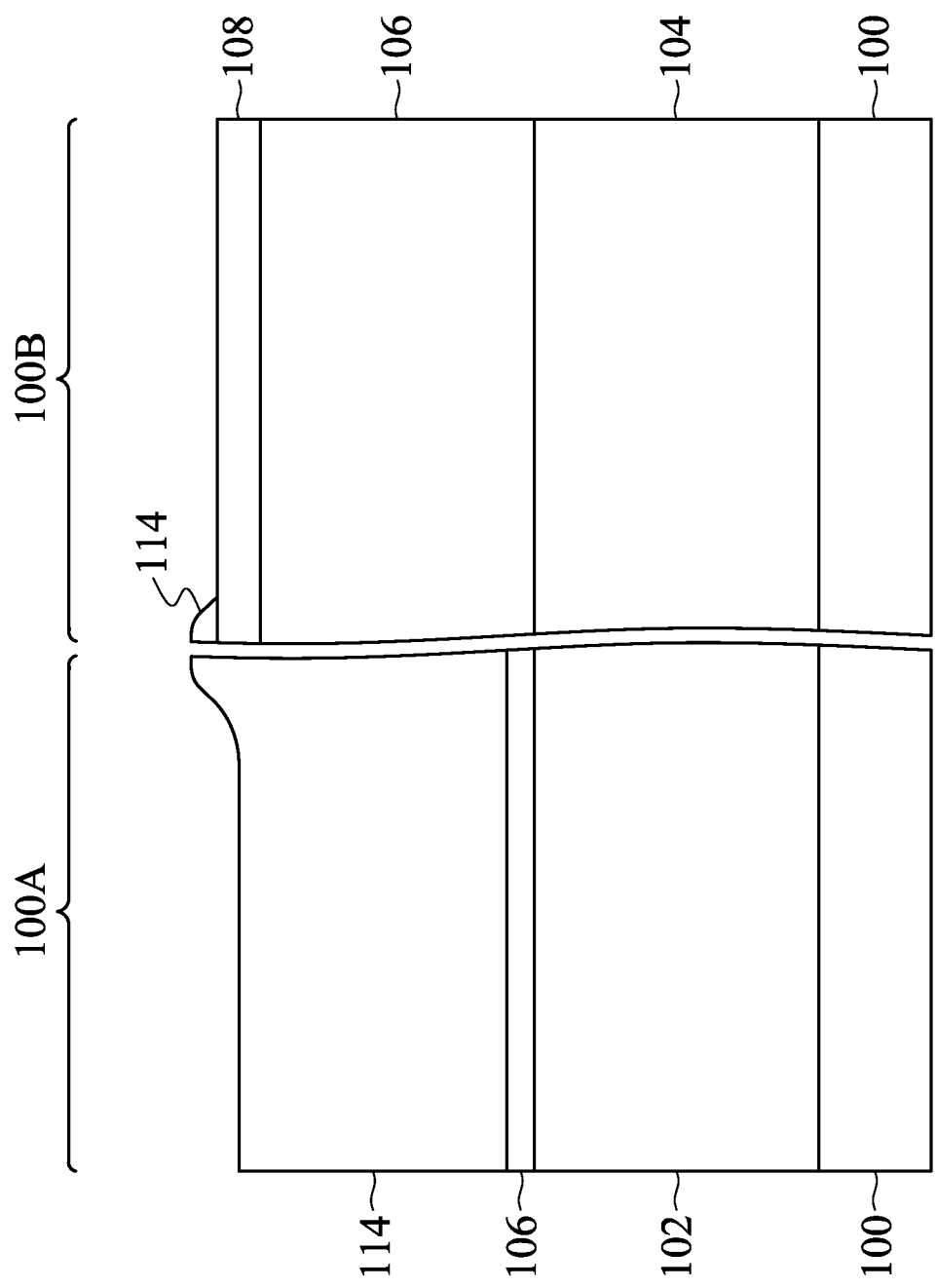
FIG. 5 illustrates a cross-sectional view of a formation of a second epitaxial layer, in accordance with some embodiments.

In FIG. 5, a second epitaxial layer 114 is formed in the first opening 112. The second epitaxial layer 114 may be formed by a process such as epitaxial growth or the like. The second epitaxial layer 114 may comprise a material such as silicon germanium (SiGe) (e.g., single-crystalline/monocrystalline silicon germanium), or the like. In embodiments in which the first region 100A is a PMOS region, the second epitaxial layer 114 may comprise a material having a greater lattice constant than the lattice constant of the first epitaxial layer 106. For example, in some embodiments, the second epitaxial layer 114 may comprise SiGe. SiGe comprises a lower bandgap than Si, allowing for greater hole mobility for subsequently formed PMOS devices.

As illustrated in FIG. 5, the second epitaxial layer 114 may fill the first opening 112 such that a top surface of the second epitaxial layer 114 is disposed above a top surface of the first epitaxial layer 106. The second epitaxial layer 114 may be formed to a thickness such that a subsequent planarization process of the first epitaxial layer 106 and the second epitaxial layer 114 will create a planar surface. In some embodiments, at least a portion of the second epitaxial layer 114 may extend over the mask layer 108.

Figure 6:
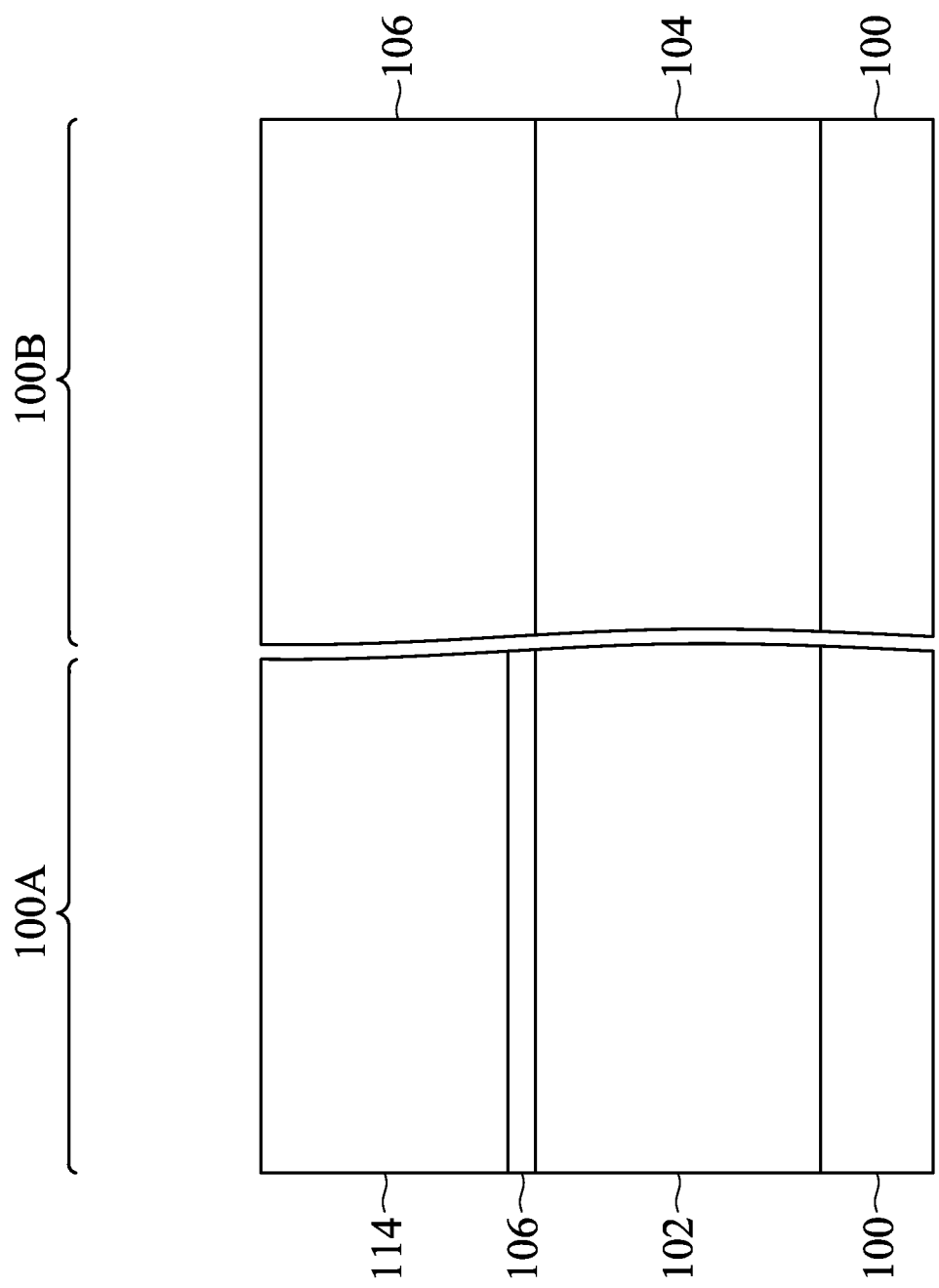
FIG. 6 illustrates a cross-sectional view of a planarization of the first epitaxial layer and the second epitaxial layer, in accordance with some embodiments.

In FIG. 6, the mask layer 108 is removed and a planarization process is performed on the first epitaxial layer 106 and the second epitaxial layer 114. The mask layer 108 may be removed using a suitable etch process, such as a wet etch process (e.g., dilute hydrofluoric (dHF) acid, or the like). The first epitaxial layer 106 and the second epitaxial layer 114 may be planarized by any suitable planarization process, such as a chemical mechanical polish (CMP), an etch-back process, combinations thereof, or the like. As illustrated in FIG. 6, following the planarization process, top surfaces of the first epitaxial layer 106 may be level with top surfaces of the second epitaxial layer 114. In some embodiments, following the planarization process, the second epitaxial layer 114 may have a thickness of between about 1 Å and about 299 Å, and the first epitaxial layer 106 in the second region 100B may have a thickness of between about 1 Å and about 300 Å.

Figure 7:
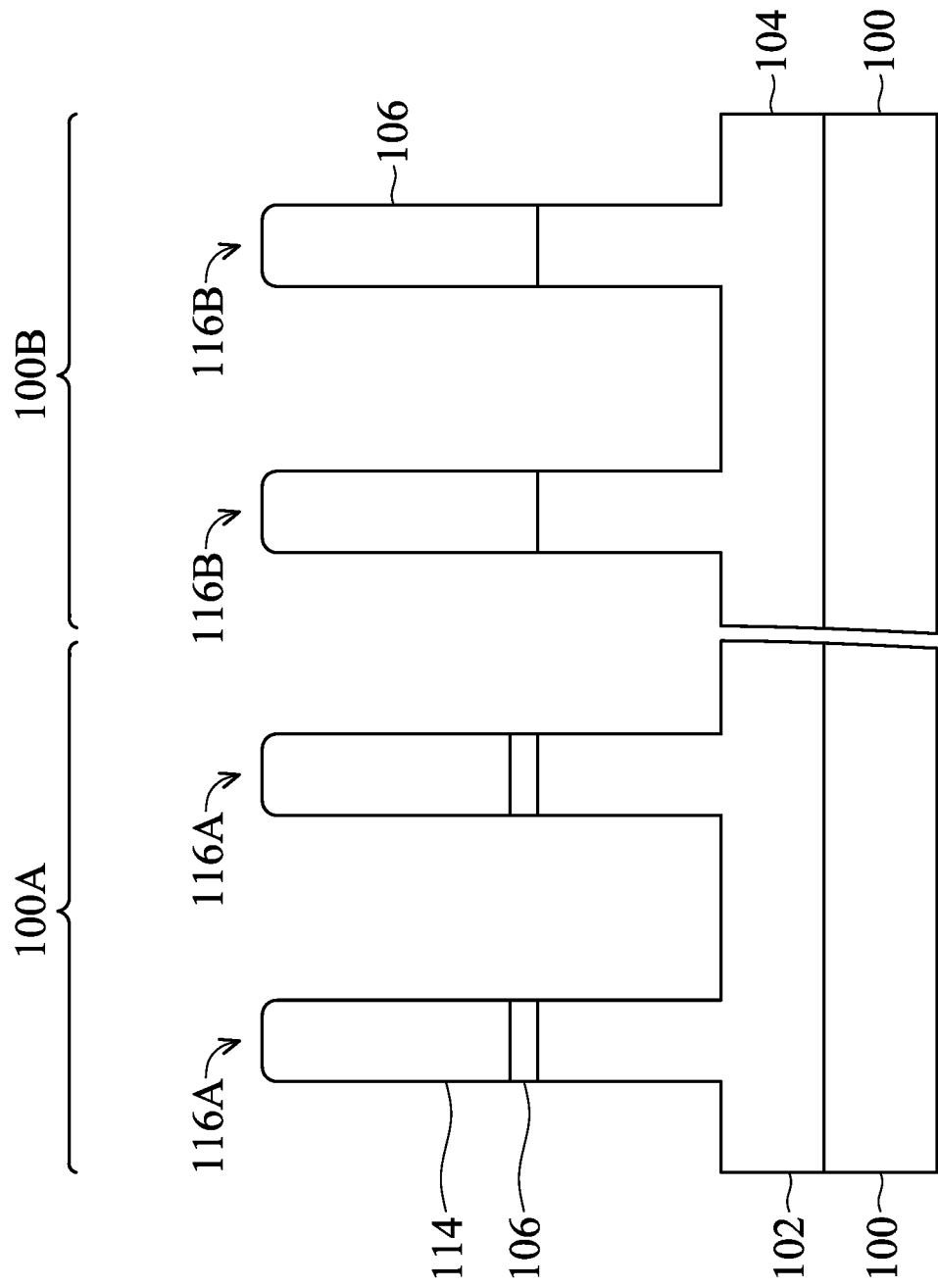
FIG. 7 illustrates a cross-sectional view of a formation of first semiconductor fins and second semiconductor fins, in accordance with some embodiments.

In FIG. 7, the second epitaxial layer 114, the first epitaxial layer 106, the n-well region 102, and the p-well region 104 are etched to form first semiconductor fins 116A in the first region 100A and second semiconductor fins 116B in the second region 100B. In some embodiments, the first semiconductor fins 116A and the second semiconductor fins 116B may be formed by etching trenches in the second epitaxial layer 114, the first epitaxial layer 106, the n-well region 102, and the p-well region 104. The etching may be one or more of any acceptable etch process, such as a reactive ion etch (RIE), a neutral beam etch (NBE), the like, or a combination thereof. The etching may be anisotropic. Although the first semiconductor fins 116A and the second semiconductor fins 116B are illustrated as having rounded corners and linear edges, the first semiconductor fins 116A and the second semiconductor fins 116B may have any other suitable shape, such as having tapered sidewalls. In some embodiments, the first semiconductor fins 116A and the second semiconductor fins 116B may have a height of between about 10 Å and about 5,000 Å.

The first semiconductor fins 116A and the second semiconductor fins 116B may be patterned by any suitable method. For example, the first semiconductor fins 116A and the second semiconductor fins 116B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Although a double-patterning or multi-patterning process is not separately illustrated, in one embodiment, the double-patterning or multi-patterning process may include forming a sacrificial layer over a substrate. The sacrificial layer is patterned using a photolithography process. Spacers are formed alongside the sacrificial layer using a self-aligned process. The sacrificial layer is then removed and the remaining spacers are used to pattern first semiconductor fins 116A and second semiconductor fins 116B.

Including the second epitaxial layer 114 formed of, e.g., silicon germanium in the first semiconductor fins 116A in the first region 100A (e.g., the PMOS region) may increase the hole mobility of subsequently formed PMOS transistors. Additionally, because germanium has a smaller bandgap than silicon, including the second epitaxial layer 114 in the first semiconductor fins 116A may yield a higher current in subsequently formed PMOS transistors.

Figure 8:
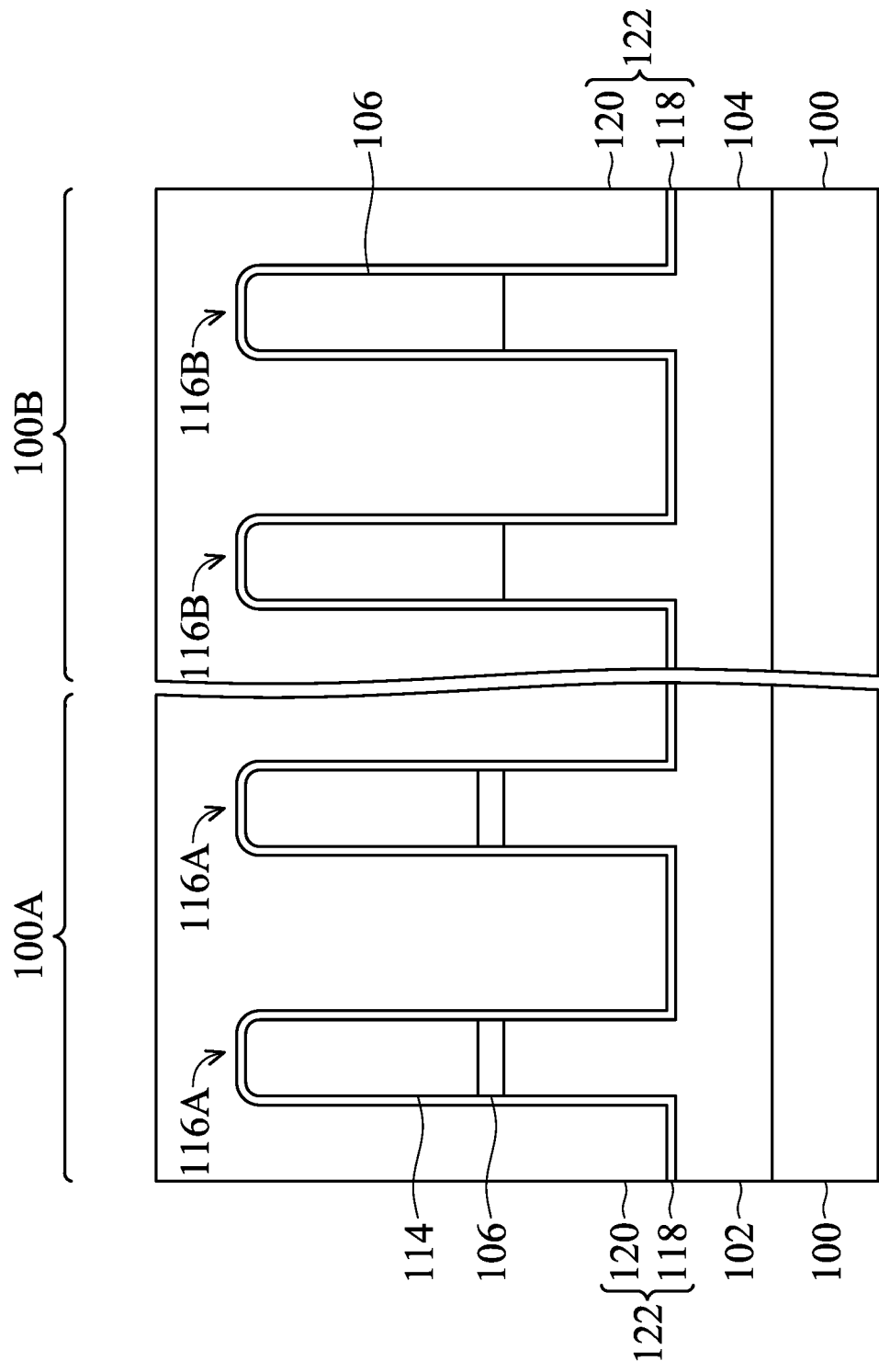
FIG. 8 illustrates a cross-sectional view of a formation of an insulating material, in accordance with some embodiments.

In FIG. 8, an insulation material 122 is formed over the substrate 100, the first semiconductor fins 116A, and the second semiconductor fins 116B, filling openings between the first semiconductor fins 116A and the second semiconductor fins 116B. In some embodiments, the insulation material 122 includes a liner 118 and a dielectric material 120 over the liner 118, as illustrated in FIG. 8. The liner 118 may be formed as a conformal layer, whose horizontal portions and vertical portions have thicknesses close to each other.

In some embodiments, the liner 118 is formed by oxidizing exposed surfaces of the substrate 100, the first semiconductor fins 116A, and the second semiconductor fins 116B in an oxygen-containing environment, for example, through Local Oxidation of Silicon (LOCOS), wherein oxygen ($O_2$) may be included in the respective process gas. In other embodiments, the liner 118 may be formed using, for example, In-Situ Steam Generation (ISSG) with water steam or a combined gas of hydrogen ($H_2$) and oxygen ($O_2$) used to oxidize the exposed surfaces of the substrate 100, the first semiconductor fins 116A, and the second semiconductor fins 116B. The ISSG oxidation may be performed at an elevated temperature. In yet other embodiments, the liner 118 is formed using a deposition technique, such as ALD, CVD, sub-atmospheric chemical vapor deposition (SACVD), the like, or a combination thereof. In some embodiments, the liner 118 may have a thickness of between about 0.2 Å and about 100 Å.

The dielectric material 120 is formed to fill remaining portions of the openings between the first semiconductor fins 116A and the second semiconductor fins 116B. The dielectric material 120 may overfill the openings between the first semiconductor fins 116A and the second semiconductor fins 116B, such that a portion of the dielectric material 120 extends above top surfaces of the first semiconductor fins 116A and the second semiconductor fins 116B. In some embodiments, the dielectric material 120 may comprise silicon oxide, silicon carbide, silicon nitride, the like, or a combination thereof, and may be formed using flowable chemical vapor deposition (FCVD), spin-on coating, CVD, ALD, high-density plasma chemical vapor deposition (HDPCVD), low pressure chemical vapor deposition (LPCVD), the like, or a combination thereof. After the dielectric material 120 is deposited, an anneal/curing step may be performed, which may convert the flowable dielectric material 120 into a solid dielectric material. In some embodiments, an interface between the liner 118 and the dielectric material 120 may be distinguishable due to different material properties such as different types of materials and/or different densities.

Figure 9:
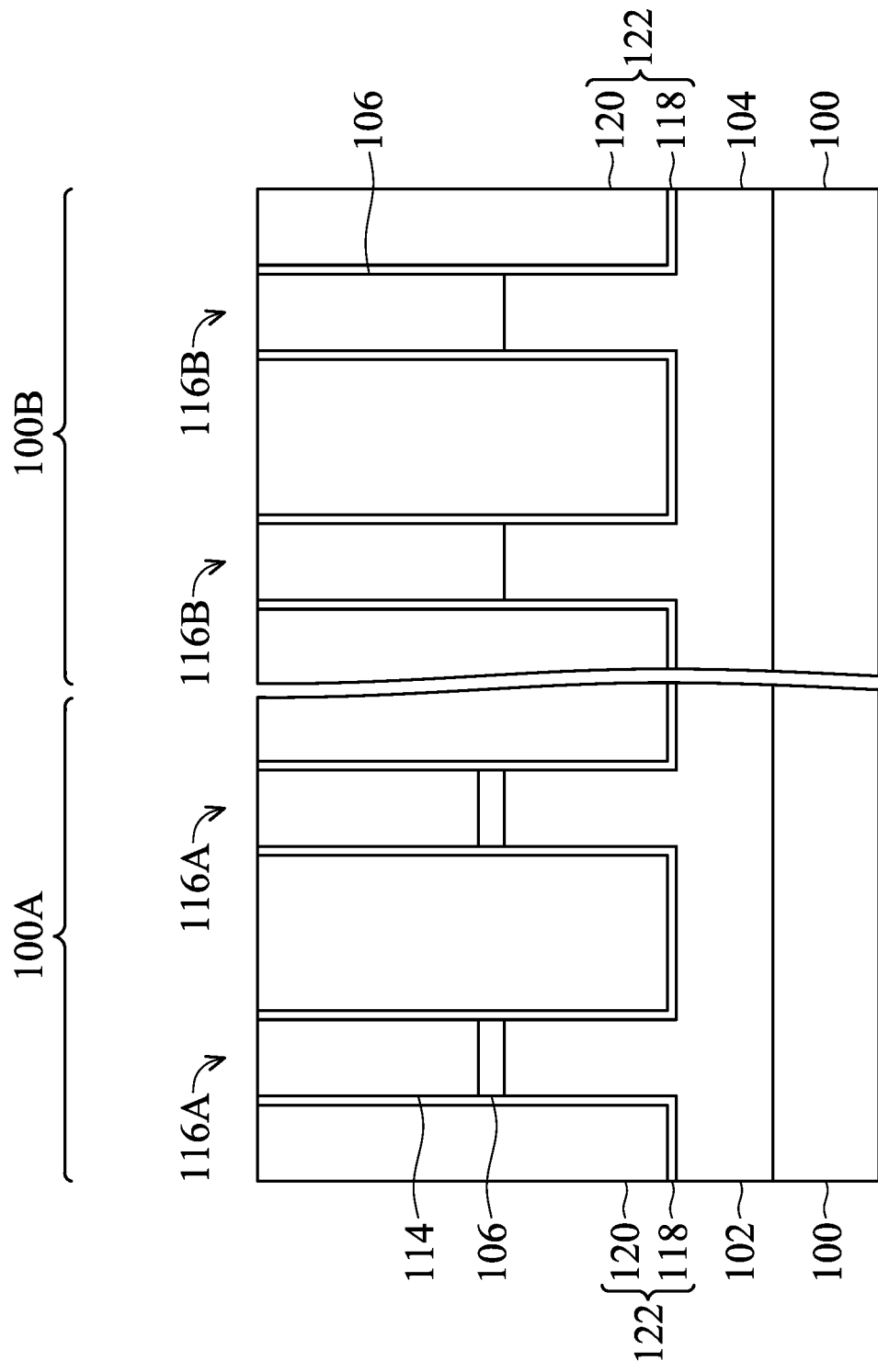
FIG. 9 illustrates a cross-sectional view of a planarization of the insulating material, the first semiconductor fins, and the second semiconductor fins, in accordance with some embodiments.

In FIG. 9, a planarization process is applied to the insulation material 122. In some embodiments, the planarization process includes a chemical mechanical polish (CMP), an etch-back process, combinations thereof, or the like. As illustrated in FIG. 9, the planarization process may expose top surfaces of the first semiconductor fins 116A and the second semiconductor fins 116B. Portions of the first semiconductor fins 116A and the second semiconductor fins 116B may also be planarized by the planarization process. Top surfaces of the first semiconductor fins 116A, the second semiconductor fins 116B, and the insulation material 122 are level after the planarization process is complete.

Figure 10:
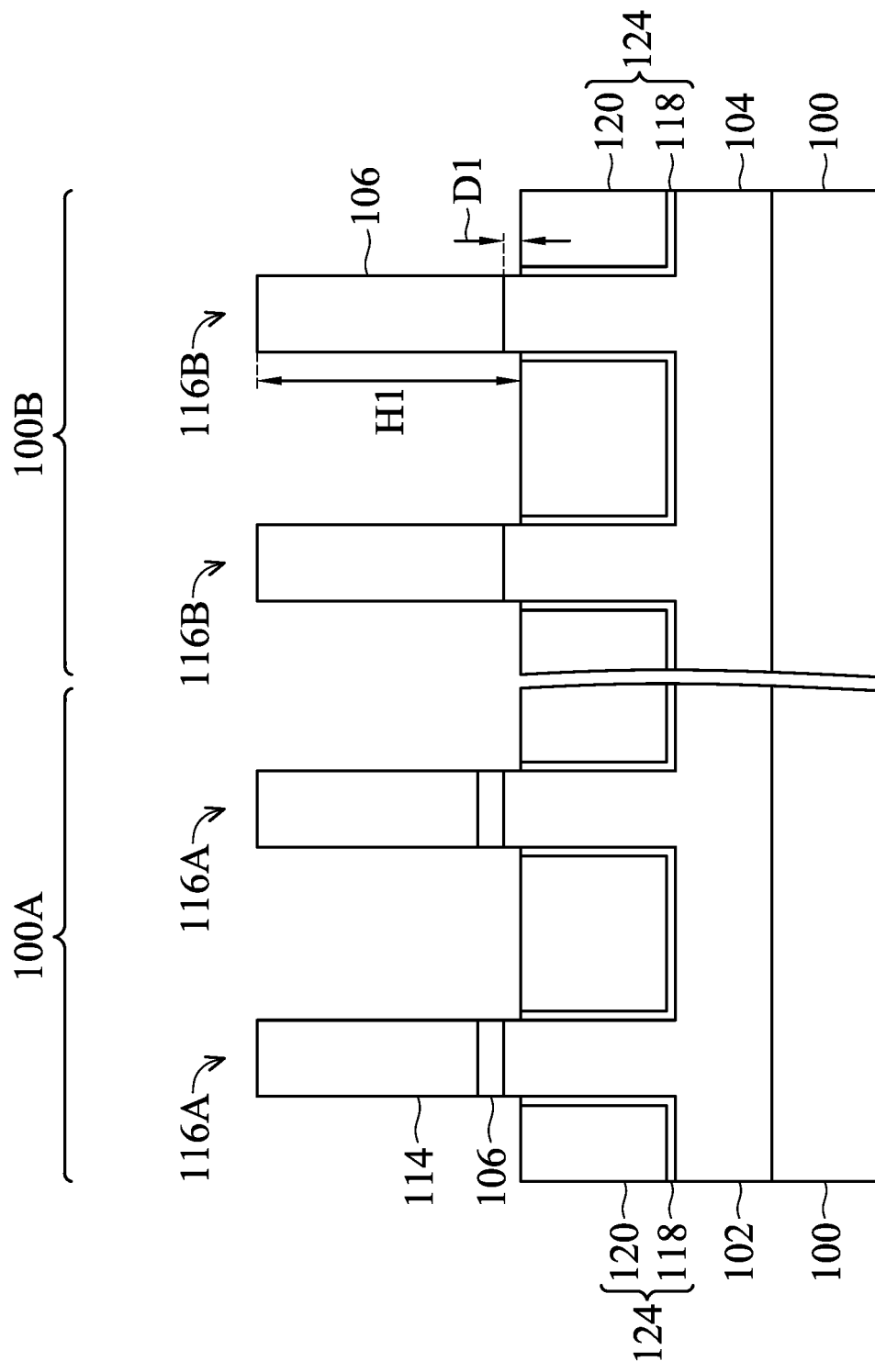
FIG. 10 illustrates a cross-sectional view of a formation of a shallow trench isolation, in accordance with some embodiments.

In FIG. 10, the insulation material 122 is recessed to form shallow trench isolation (STI) regions 124. The insulation material 122 is recessed such that the first semiconductor fins 116A and the second semiconductor fins 116B in the first region 100A and in the second region 100B protrude from between neighboring STI regions 124. As illustrated in FIG. 10, the insulation material 122 may be recessed such that the first epitaxial layer 106, the second epitaxial layer 114, and at least portions of the n-well region 102 and the p-well region 104 protrude from the STI regions 124. The n-well region 102 and the p-well region 104 may protrude from the STI regions 124 by a distance D1 of between about 1 Å and about 100 Å. The exposed portions of the first semiconductor fins 116A and the second semiconductor fins 116B may have a height H1 measured from a top surface of the STI regions to top surfaces of the first semiconductor fins 116A and the second semiconductor fins 116B of between about 1 Å and about 5,000 Å. The STI regions 124 may be recessed using an acceptable etching process, such as one that is selective to the material of the STI regions 124. For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

Figure 11A:
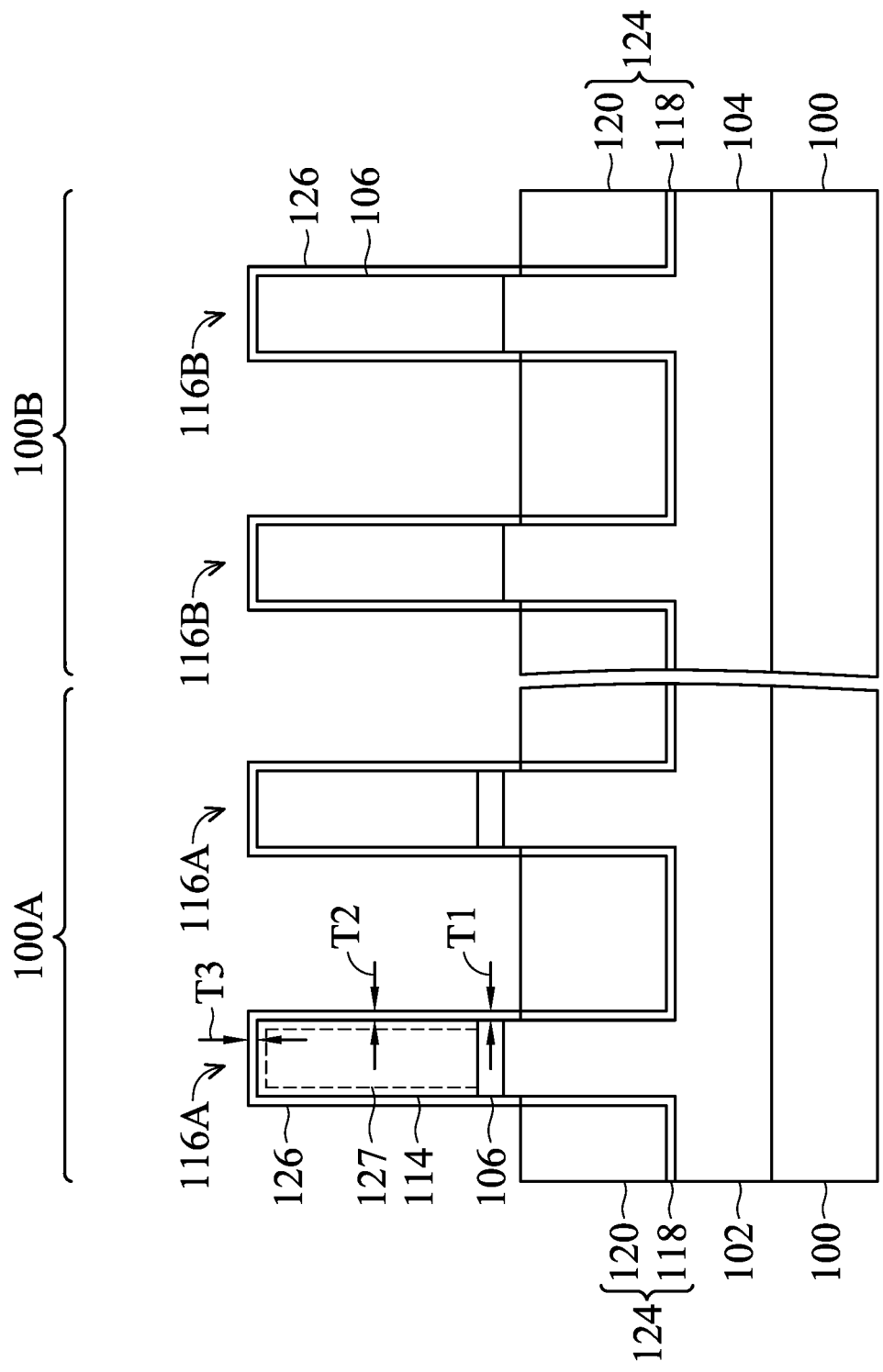
FIGS. 11A and 11B illustrate cross-sectional views of a formation of a cap layer, in accordance with some embodiments.
Figure 11B:
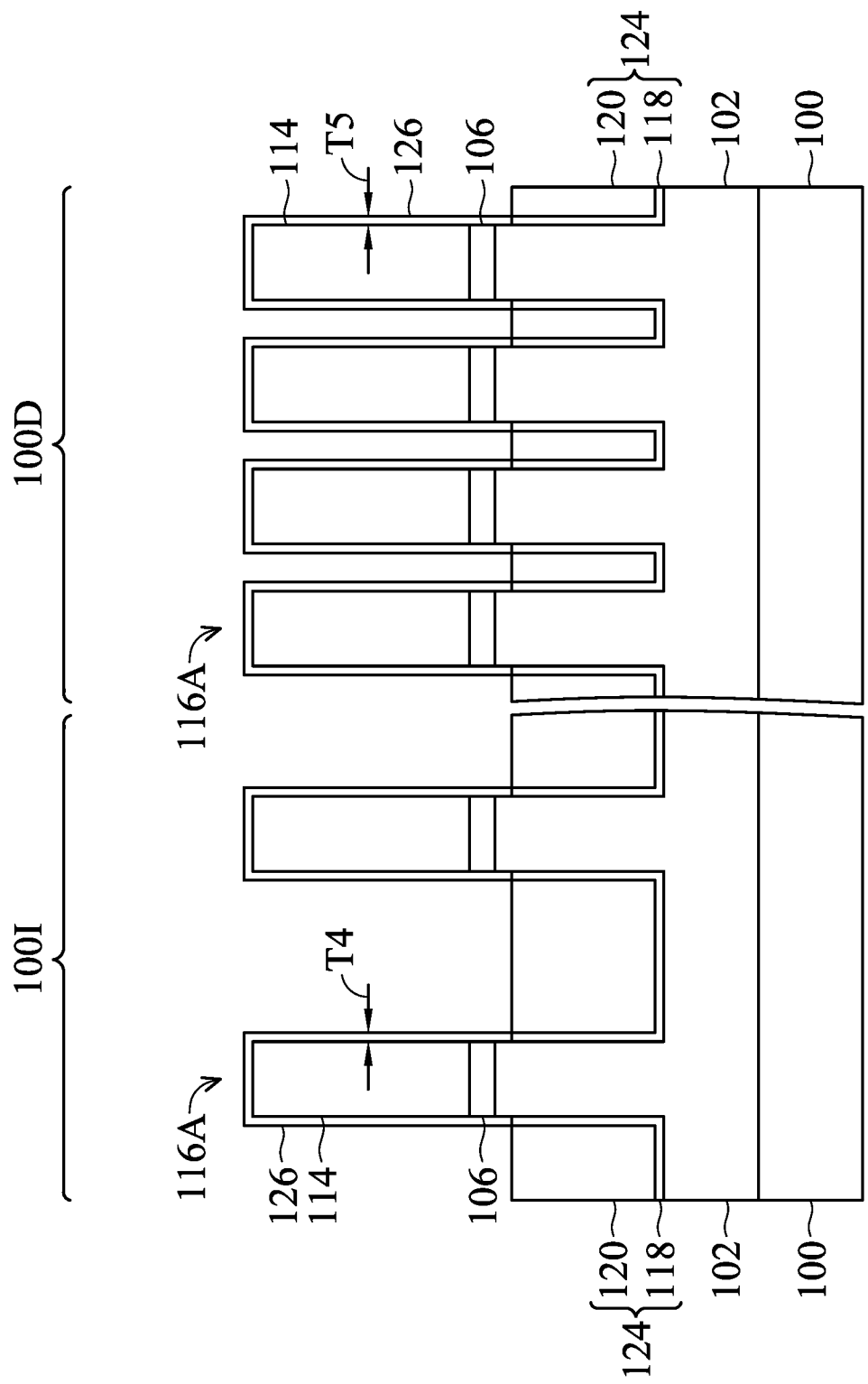

In FIGS. 11A and 11B, a cap layer 126 is formed on exposed portions of the first semiconductor fins 116A and the second semiconductor fins 116B. The cap layer 126 may be formed over the first semiconductor fins 116A and the second semiconductor fins 116B to reduce out-diffusion of germanium from the first semiconductor fins 116A into subsequently formed overlying layers. In some embodiments, the cap layer 126 may be formed of silicon (e.g., poly-crystalline silicon) or the like. The cap layer 126 may have a lattice constant smaller than the lattice constant of the second epitaxial layer 114 and about the same as the lattice constant of the first epitaxial layer 106. The cap layer 126 may have a thickness of between about 0.2 Å and about 100 Å. The cap layer 126 may be formed by CVD, furnace CVD, ALD, epitaxial growth, or the like. In a specific embodiment, the cap layer 126 may be formed by loading the substrate 100 illustrated in FIG. 10 into a furnace, performing a pre-clean process on the first semiconductor fins 116A and the second semiconductor fins 116B, performing a sublimation process, depositing the cap layer on the first semiconductor fins 116A and the second semiconductor fins 116B, and cooling the substrate 100.

As an initial step in forming the cap layer 126, a pre-clean process is performed on the exposed portions of the first semiconductor fins 116A and the second semiconductor fins 116B to remove a native oxide layer resulting from oxidation of the exposed surfaces of the first semiconductor fins 116A and the second semiconductor fins 116B. In some embodiments, the pre-clean may be performed using a process gas such as an HF-based gas, a SiCoNi-based gas, or the like. In other embodiments, the pre-clean may be performed using a wet etch with an etchant such as a solution including hydrofluoric acid (HF); although other etchants, such as $H_2$, and other methods, such as a reactive ion etch, a dry etch with etchants such as $NH_3/NF_3$, chemical oxide removal, or dry chemical clean may be used. In still further embodiments, the pre-clean may use an $NH_3$ remote plasma pre-clean process. The pre-clean process may be performed in situ (e.g., in the same position or in the same semiconductor processing chamber) after the substrate 100 is loaded into the furnace. In other embodiments, the pre-clean process may be performed ex situ before the substrate 100 is loaded into the furnace. The pre-clean process may be performed at a temperature of between about 50° C. and about 350° C., at a pressure of between about 0.5 Torr and about 700 Torr, for a period of between about 5 seconds and about 250 seconds. The pre-clean process may use a carrier gas, such as argon (Ar) and the gas used in the pre-clean process (e.g., the process gas and the carrier gas) may have a flowrate of between about 0.1 SLM and about 100 SLM.

The pre-clean process may improve the adhesion of the cap layer 126 to the first semiconductor fins 116A and the second semiconductor fins 116B.

A sublimation process is performed in the furnace in order to prepare a precursor gas for depositing the cap layer 126. Precursors that may be used for the deposition of the cap layer 126 include silane ($SiH_4$), dichlorosilane ($SiH_2Cl_2$, also referred to as DCS), disilane ($Si_2H_6$), combinations thereof, or the like. In some embodiments, silicon may be sublimated in the presence of a carrier gas, such as hydrogen ($H_2$) gas. The sublimation process may be conducted in a hydrogen ambient atmosphere. The sublimation process may be performed at a temperature of between about 50° C. and about 300° C. During the sublimation process, the partial pressure of hydrogen gas in the furnace may be between about 1 mTorr and about 4 mTorr. The sublimation process may be used to stabilize the temperature, pressure, and precursor gas flowrate in the furnace prior to depositing the cap layer 126 on the first semiconductor fins 116A and the second semiconductor fins 116B. Moreover, performing the sublimation process using the specified process conditions (e.g., temperature and pressure), decreases out-diffusion of germanium from the first semiconductor fins 116A to ambient, improving germanium abruptness (e.g., a change in germanium concentration) between the material of the first semiconductor fins 116A and the material of the subsequently deposited cap layer 126.

The cap layer 126 is then deposited on the first semiconductor fins 116A and the second semiconductor fins 116B in a cap layer deposition process by raising the temperature of the furnace. In an embodiment, increasing the temperature of the furnace causes decomposition of the precursor gas and silicon from the precursor gas is deposited on the first semiconductor fins 116A and the second semiconductor fins 116B. The temperature of the furnace may be raised to a temperature of between about 200° C. and about 450° C., such as about 340° C. or about 380° C. The furnace may have a pressure of between about 0 Torr and about 120 Torr. The deposition process of the cap layer 126 may last or have an incubation time of from about 5 seconds to about 100 seconds. Hydrogen gas may be flowed over the substrate 100 during the cap layer 126 deposition process along with the precursor gas (e.g., as a co-flow) at a flowrate of between about 200 sccm (0.2 slm) and about 5,000 sccm (5 slm). The precursor gas (e.g., silane, dichlorosilane, disilane, combinations thereof, or the like) may be flowed over the substrate 100 during the cap layer 126 deposition process at a flowrate of between about 200 sccm and about 800 sccm. Depositing the cap layer 126 using the specified process conditions (e.g., incubation time, temperature, and pressure), as well as flowing the hydrogen gas with the precursor gas, each decrease out-diffusion of germanium from the first semiconductor fins 116A into the cap layer 126 and to ambient, improving germanium abruptness (e.g., a change in germanium concentration) between the material of the first semiconductor fins 116A and the material of the cap layer 126.

The substrate 100 is then cooled. The substrate 100 may be cooled by flowing a cooling gas (e.g., a nitrogen ($N_2$) gas or the like) over the substrate 100, or by using a water coil or the like. The cooling gas may have a temperature of between about 25° C. and about 380° C. The substrate 100 may be cooled for a period of between about 20 seconds and about 120 seconds. The substrate 100 may be cooled to a temperature of between about 60° C. and about 18° C.

The resulting cap layer 126 may have an interface trap density (a measure of dangling bond concentration per $cm^2$) of less than about $1 \times 10^{11}$ $cm^{-2}$ $eV^{-1}$. In some embodiments, there may be some intermixing between a silicon material of the cap layer 126 and a silicon germanium material of the first semiconductor fins 116A to form an intermixed layer 127 (illustrated by dashed lines in FIG. 11) in the first semiconductor fins 116A adjacent the cap layer 126. The intermixed layer 127 may have a lower concentration of germanium than the remainder of the second epitaxial layer 114 of the first semiconductor fins 116A and, as such, the intermixed layer 127 may be referred to as a depleted region of the first semiconductor fins 116A. The intermixed layer 127 may have a thickness of between about 0.5 Å and about 20 Å. Bottom portions of the cap layer 126 may have a thickness T1 of between about 0.2 Å and about 10 Å. Middle portions of the cap layer 126 (disposed about halfway up the portions of the first semiconductor fins 116A and the second semiconductor fins 116B exposed in FIG. 10) may have a thickness T2 of between about 0.2 Å and about 10 Å. Portions of the cap layer 126 disposed on top surfaces of the first semiconductor fins 116A and the second semiconductor fins 116B may have a thickness T3 of between about 0.2 Å and about 10 Å. The cap layer 126 may have an average thickness of between about 0.2 Å and about 10 Å, such as about 4.55 Å.

In some embodiments, the cap layer 126 may be selectively formed on the first semiconductor fins 116A and the second semiconductor fins 116B, without being formed on the STI regions 124. However, in other embodiments, material of the cap layer 126 may be deposited on the STI regions 124. This phenomenon of material of the cap layer 126 being formed on the STI regions 124 is sometimes termed selective loss or selectivity loss, because in an ideal process, the material of the cap layer 126 would grow only on exposed portions of the first semiconductor fins 116A and the second semiconductor fins 116B, not on the STI region 124—e.g. complete selectivity. The selectivity loss on the STI regions 124 may be less than about 10 Å.

Forming the cap layer 126 according to the above-described low-temperature process may result in less out-diffusion of germanium from the first semiconductor fins 116A to ambient and into the cap layer 126 than alternative processes, thus there is greater abruptness in the change of germanium concentration between the material of the first semiconductor fins 116A and the material of the cap layer 126. This may result in the intermixed layer 127 between the cap layer 126 and the first semiconductor fins 116A being less thick than an intermixed layer in a cap layer formed by alternative processes. The germanium concentration in the cap layer 126, the intermixed layer 127, and the first semiconductor fins 116A may vary with depth. For example, the germanium concentration in the cap layer 126 may be about zero atomic percent. The germanium concentration in the intermixed layer 127 may be close to zero atomic percent at the boundary of the cap layer 126 and may quickly increase, then begin to level off as the depth approaches the first semiconductor fins 116A. The germanium concentration may become flat (e.g., the germanium concentration may not rise or fall) at from about 15 atomic percent to about 30 atomic percent as the depth further increases (e.g., the germanium concentration in the first semiconductor fins 116A may be from about 15 atomic percent to about 30 atomic percent).

Moreover, out-diffusion of germanium from semiconductor fins can cause the semiconductor fins to bend or warp (referred to as a wiggle effect) and this increases the line edge roughness of the semiconductor fins. Further, out-diffusion of germanium can cause triangular protrusions (referred to as small wings) to be formed extending from lowermost sidewalls of the semiconductor fins. Both of these variations caused by the out-diffusion of germanium from the semiconductor fins can cause variations in the threshold voltage (Vt) of subsequently formed transistors.

Forming the first semiconductor fins 116A according to the above-described low-temperature process reduces the out-diffusion of germanium from the first semiconductor fins 116A. Because the out-diffusion of germanium is reduced, the wiggle effect in the first semiconductor fins 116A (e.g., bending or warping along the length of the first semiconductor fins 116A) is reduced, the first semiconductor fins 116A have improved line edge roughness (LER) (e.g., reduced LER), and the formation of small wings adjacent the first semiconductor fins 116A is reduced. As a result of these improvements, variations in the threshold voltage ($V_t$) of subsequently formed transistors are reduced. In some embodiments, the LER of the first semiconductor fins 116A after formation of the cap layer 126 may be less than about 10 nm or less than about 0.1 nm.

FIG. 11B illustrates the first semiconductor fins 116A in an isolated area 100I and a dense area 100D. As illustrated in FIG. 11B, the substrate 100 may include both the isolated area 100I and the dense area 100D, wherein the dense area 100D is defined to be an area with a high density of fins thereon (e.g., an area with a fin density of between about 8 fins/unit and about 30 fins/unit), while the isolated area 100I is defined to be an area with a low density of fins thereon (e.g., an area with a fin density of between about 1 fins/unit and about 8 fins/unit). The above-described low-temperature process for forming the cap layer 126 is performed at a pressure of between about 0 Torr and about 120 Torr. This low pressure may lead to a more symmetrical impingement rate of the precursor gas with the first semiconductor fins 116A and may improve the uniformity of the deposition process for forming the cap layer 126 relative to a process using higher pressures. As such, a difference between a thickness T4 of the cap layer 126 in the isolated area 100I and a thickness T5 of the cap layer 126 in the dense area 100D may be less than about 10 Å, such as about 0.07 Å, or less than about 0.005 Å. Forming the cap layer 126 using the above-described low-temperature process may reduce the difference in the thickness of the cap layer 126 between the isolated area 100I and the dense area 100D, which may reduce iso-dense loading effects.

The combination of the cap layer 126 and the first semiconductor fins 116A may function as a p-type channel in subsequently formed transistors and the combination of the cap layer 126 and the second semiconductor fins 116B may function as an n-type channel in subsequently formed transistors. Forming the first semiconductor fins 116A of silicon germanium results in p-type fully strained channels having reduced channel resistance (e.g., $R_{channel}$) and highly efficient mobility. The first semiconductor fins 116A may provide good drain-induced barrier loading (DIBL) and good $I_{on}$-$I_{off}$ (e.g., high on current $I_{on}$ and low leakage current $I_{off}$), as compared with semiconductor fins formed by alternative processes or including different materials. Forming the cap layer 126 over the first semiconductor fins 116A reduces defects in the first semiconductor fins 116A formed of silicon germanium.

FIGS. 12A through 21B illustrate various additional steps in the manufacturing of embodiment devices. FIGS. 12B, 13B, 14B, 15B-D, 16B, 17B, 18B, 19B, 20B, and 21B illustrate features in either of the first region 100A and the second region 100B. For example, the structures illustrated in FIGS. 12B, 13B, 14B, 15B-D, 16B, 17B, 18B, 19B, 20B, and 21B may be applicable to both the first region 100A and the second region 100B. Differences (if any) in the structures of the first region 100A and the second region 100B are described in the text accompanying each figure.

Figure 12A:
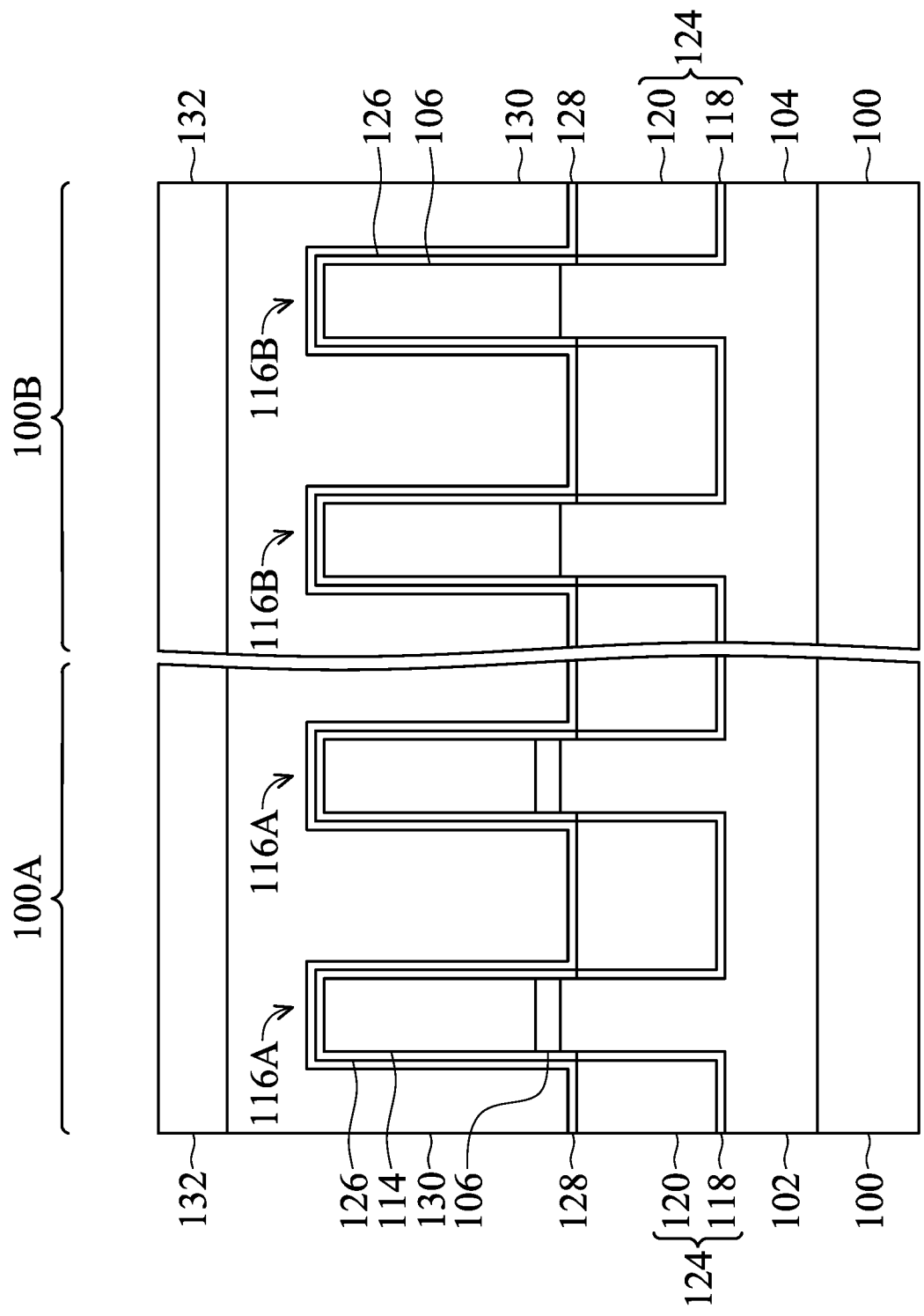
FIGS. 12A and 12B illustrate cross-sectional views of a formation of a dummy dielectric layer, a dummy gate layer, and a mask layer, in accordance with some embodiments.
Figure 12B:
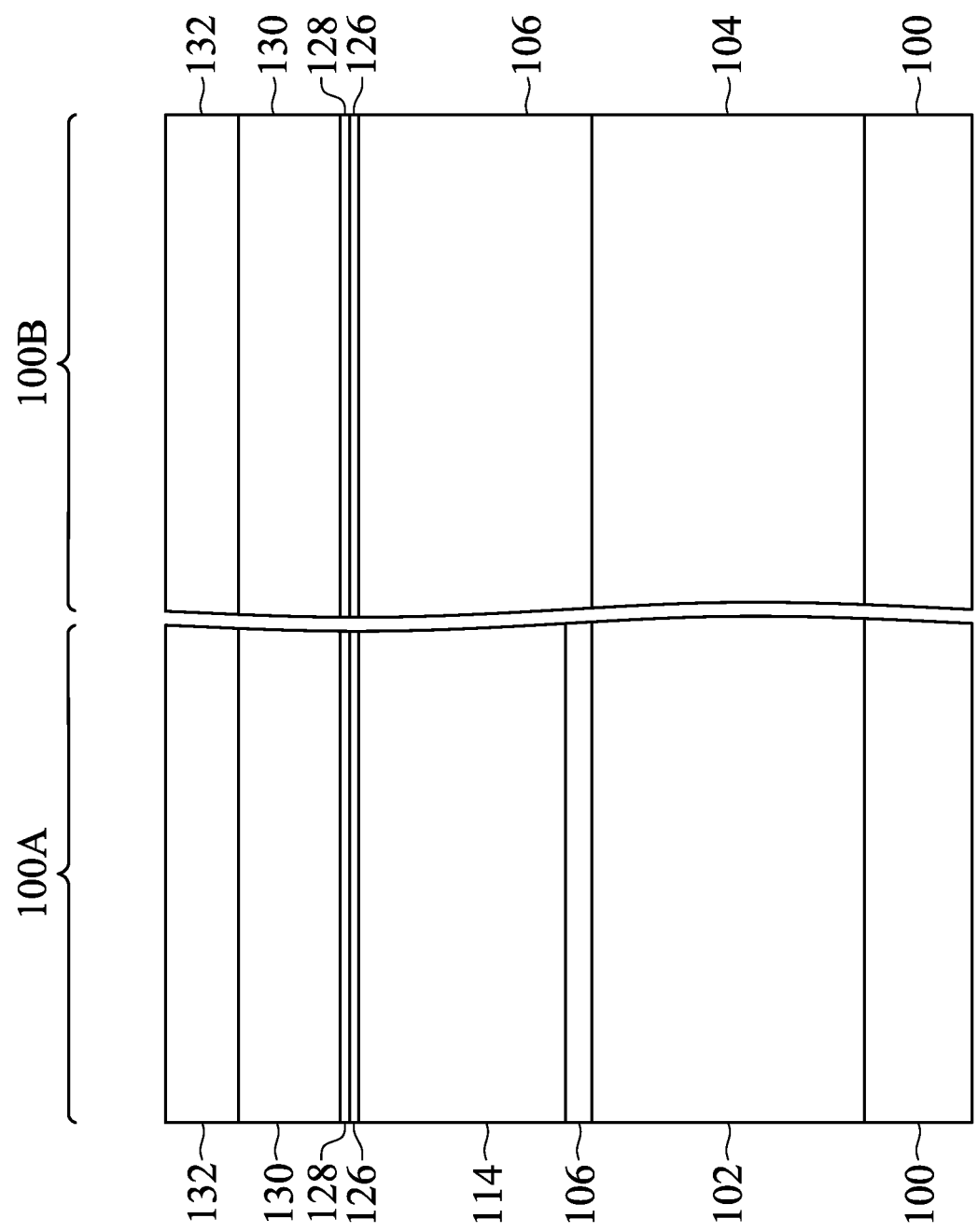

In FIGS. 12A and 12B, a dummy dielectric layer 128 is formed over the cap layer 126 and the STI regions 124. The dummy dielectric layer 128 may be, for example, silicon oxide, silicon nitride, a combination thereof, or the like, and may be deposited or thermally grown according to acceptable techniques. A dummy gate layer 130 is formed over the dummy dielectric layer 128, and a mask layer 132 is formed over the dummy gate layer 130. The dummy gate layer 130 may be deposited over the dummy dielectric layer 128 and then planarized, such as by a CMP. The mask layer 132 may be deposited over the dummy gate layer 130. The dummy gate layer 130 may be a conductive material and may be selected from a group including amorphous silicon, poly-crystalline-silicon (polysilicon), poly-crystalline silicon-germanium (poly-SiGe), metallic nitrides, metallic silicides, metallic oxides, and metals. The dummy gate layer 130 may be deposited by physical vapor deposition (PVD), CVD, sputter deposition, or other techniques known and used in the art for depositing conductive materials. The dummy gate layer 130 may be made of other materials that have a high etching selectivity from the etching of isolation regions. The mask layer 132 may include, for example, SiN, SiON, or the like. In this example, a single dummy gate layer 130 and a single mask layer 132 are formed across the regions in which the first semiconductor fins 116A and the second semiconductor fins 116B are formed. In some embodiments, separate dummy gate layers 130 and separate mask layers 132 may be formed in the region in which the first semiconductor fins 116A are formed and the region in which the second semiconductor fins 116B are formed.

Figure 13A:
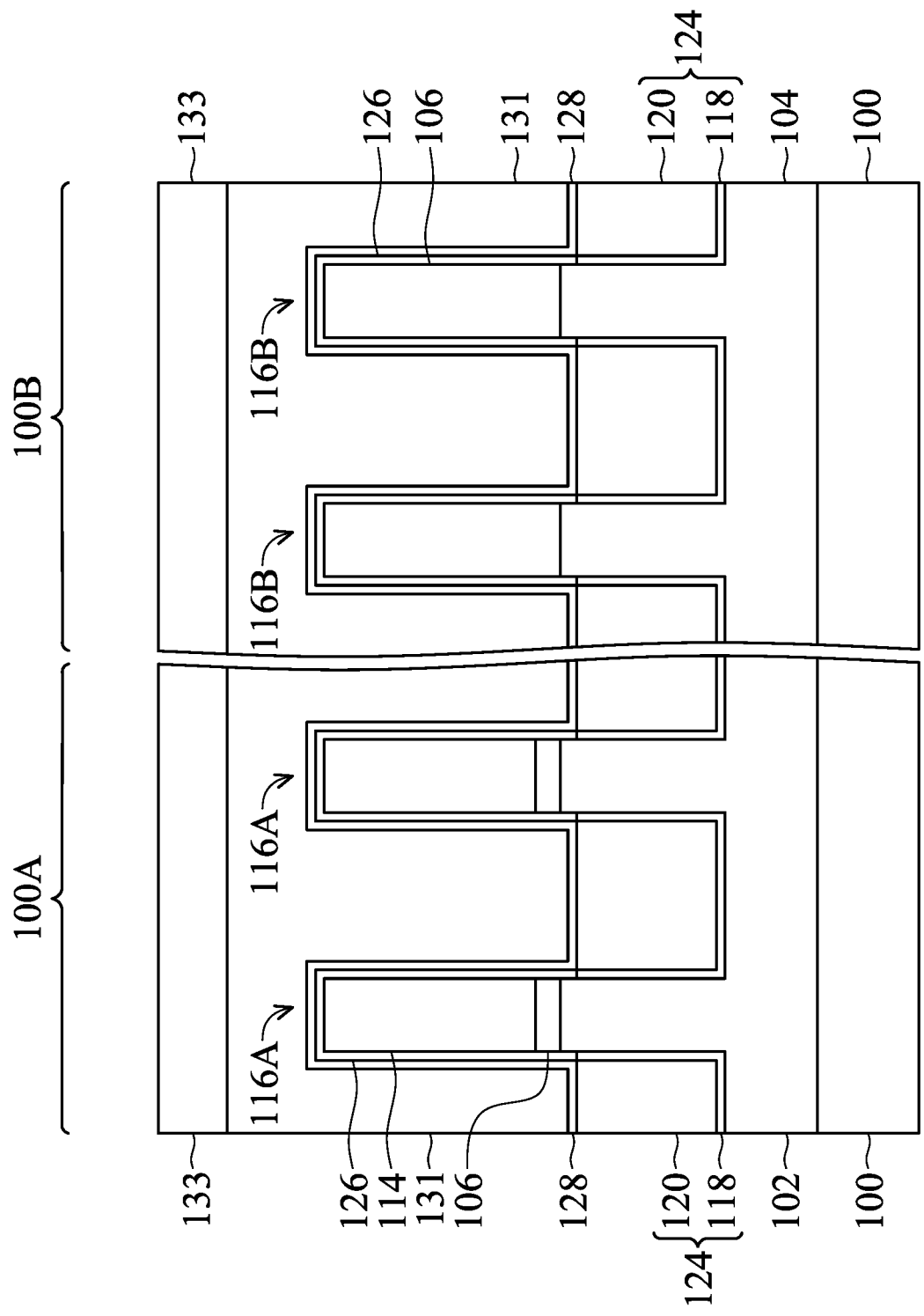
FIGS. 13A and 13B illustrate cross-sectional views of a formation of a dummy gate, masks, and gate seal spacers, in accordance with some embodiments.
Figure 13B:
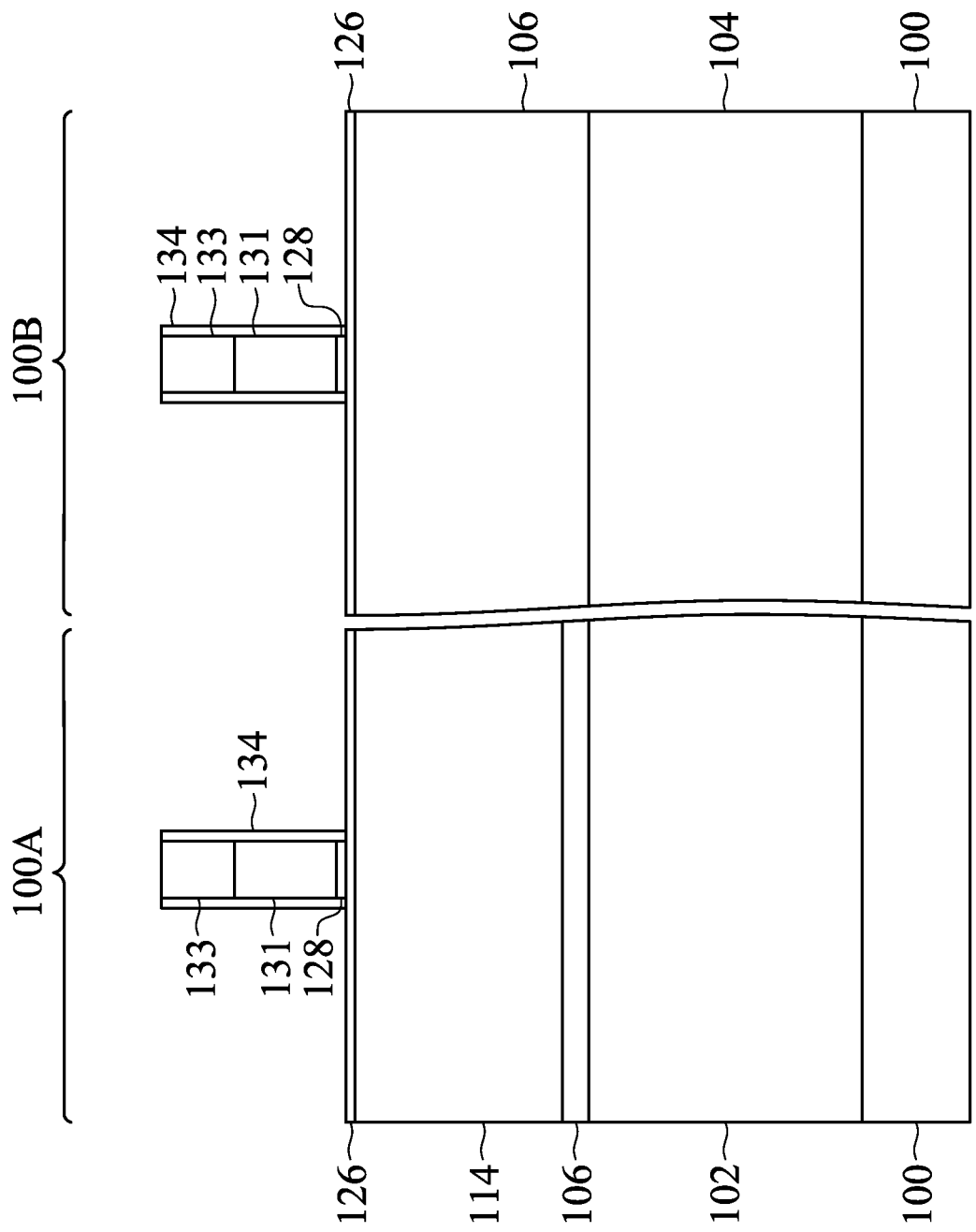

In FIGS. 13A and 13B, the mask layer 132 may be patterned using acceptable photolithography and etching techniques to form masks 133. The pattern of the masks 133 may be transferred to the dummy gate layer 130 by an acceptable etching technique to form dummy gates 131. In some embodiments, the pattern of the masks 133 may also be transferred to the dummy dielectric layer 128. The dummy gates 131 cover respective channel regions of the first semiconductor fins 116A and the second semiconductor fins 116B. The pattern of the masks 133 may be used to physically separate each of the dummy gates 131 from adjacent dummy gates 131. The dummy gates 131 may also have a lengthwise direction substantially perpendicular to the lengthwise direction of the first semiconductor fins 116A and the second semiconductor fins 116B.

As further illustrated in FIG. 13B, gate seal spacers 134 may be formed on exposed sidewalls of the dummy gates 131, the dummy dielectric layer 128, the masks 133, and/or the first semiconductor fins 116A and the second semiconductor fins 116B. A thermal oxidation or a deposition followed by an anisotropic etch may be used to form the gate seal spacers 134. Although only one gate seal spacer 134 is illustrated in FIG. 13B, the gate seal spacers 134 may comprise a plurality of layers.

After the formation of the gate seal spacers 134, implants for lightly doped source/drain (LDD) regions (not explicitly illustrated) may be performed. In the embodiments with different device types, a mask, such as a photoresist, may be formed over the first region 100A, while exposing the second region 100B, and appropriate type (e.g., n-type) impurities may be implanted into the exposed second semiconductor fins 116B in the second region 100B. The mask may then be removed. Subsequently, a mask, such as a photoresist, may be formed over the second region 100B while exposing the first region 100A, and appropriate type (e.g., p-type) impurities may be implanted into the exposed first semiconductor fins 116A in the first region 100A. The mask may then be removed. The n-type impurities may be phosphorus, arsenic, or the like, and the p-type impurities may be boron, $BF_2$, or the like. The lightly doped source/drain regions may have a concentration of impurities of from about $10^{15}$ cm$^{-3}$ to about $10^{16}$ cm$^{-3}$. An anneal may be used to activate the implanted impurities.

Figure 14A:
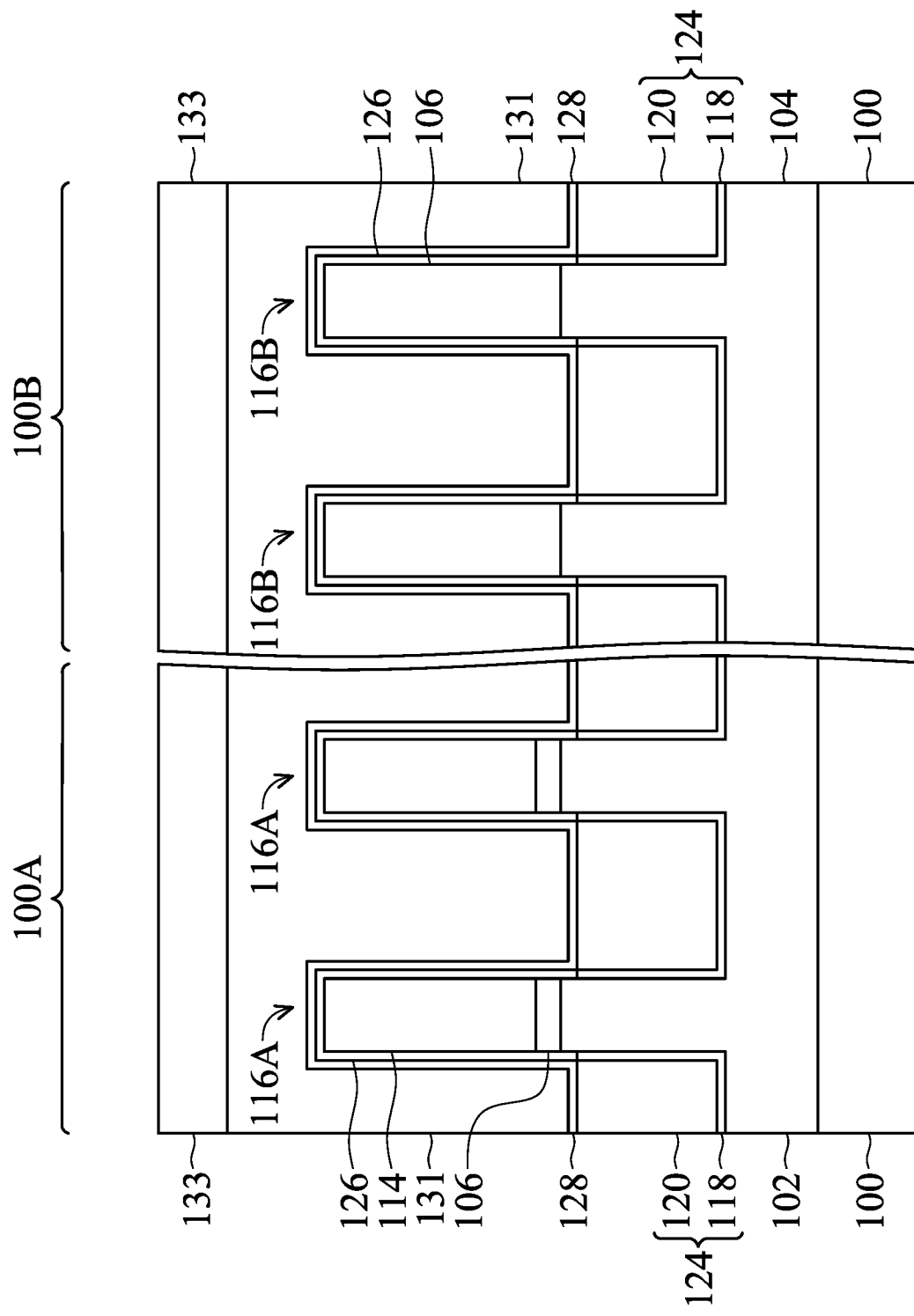
FIGS. 14A and 14B illustrate cross-sectional views of a formation of gate spacers, in accordance with some embodiments.
Figure 14B:
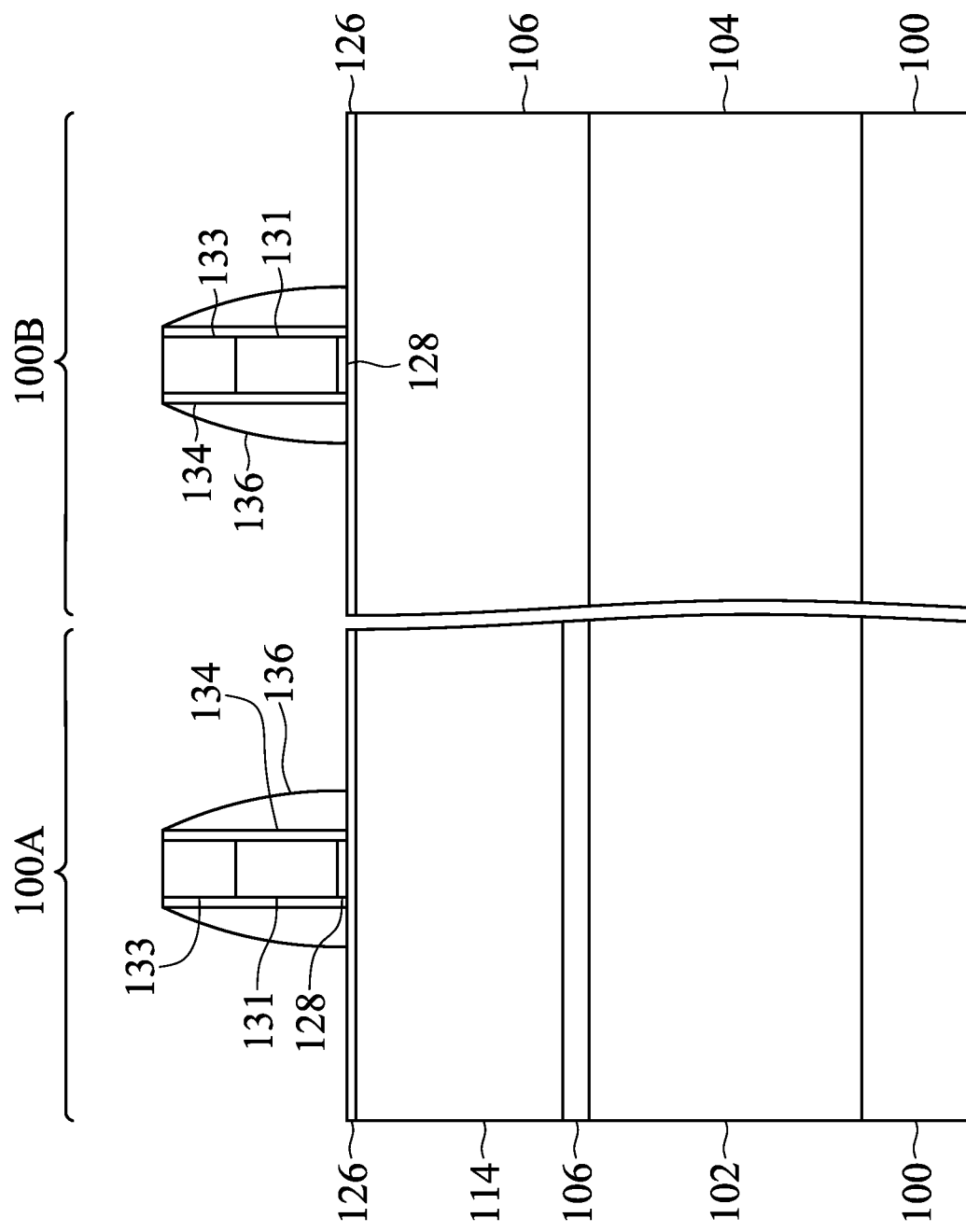

In FIGS. 14A and 14B, gate spacers 136 are formed on the gate seal spacers 134 along sidewalls of the dummy gates 131 and the masks 133. The gate spacers 136 may be formed by conformally depositing a material and subsequently anisotropically etching the material. The material of the gate spacers 136 may be silicon nitride, SiCN, a combination thereof, or the like. The gate spacers 136 may comprise a single layer or multiple layers.

In FIGS. 15A-15D epitaxial source/drain regions 138 are formed in the first semiconductor fins 116A and the second semiconductor fins 116B. The epitaxial source/drain regions 138 are formed in the first semiconductor fins 116A and the second semiconductor fins 116B such that each dummy gate 131 is disposed between respective neighboring pairs of the epitaxial source/drain regions 138. In some embodiments, the epitaxial source/drain regions 138 may extend into the first semiconductor fins 116A and the second semiconductor fins 116B. In some embodiments, the gate spacers 136 are used to separate the epitaxial source/drain regions 138 from the dummy gates 131 by an appropriate lateral distance so that the epitaxial source/drain regions 138 do not short out subsequently formed gates of the resulting FinFETs.

The epitaxial source/drain regions 138 in the first region 100A (e.g., the PMOS region) may be formed by masking the second region 100B (e.g., the NMOS region) and etching source/drain regions of the first semiconductor fins 116A in the first region 100A to form recesses in the first semiconductor fins 116A. Then, the epitaxial source/drain regions 138 in the first region 100A are epitaxially grown in the recesses. In some embodiments, the epitaxial source/drain regions 138 may extend through the second epitaxial layer 114 and the first epitaxial layer 106 into the n-well region 102 in the first region 100A. The epitaxial source/drain regions 138 may include any acceptable material appropriate for p-type FinFETs. For example, the epitaxial source/drain regions 138 in the first region 100A may include SiGe, SiGeB, Ge, GeSn, or the like. The epitaxial source/drain regions 138 in the first region 100A may be formed of a material having a greater lattice constant than the lattice constant of the second epitaxial layer 114, creating a compressive stress in the channel region to increase hole mobility for PMOS devices. The epitaxial source/drain regions 138 in the first region 100A may have surfaces raised from respective surfaces of the first semiconductor fins 116A and may have facets.

The epitaxial source/drain regions 138 in the second region 100B (e.g., the NMOS region) may be formed by masking the first region 100A (e.g., the PMOS region) and etching source/drain regions of the second semiconductor fins 116B in the second region 100B to form recesses in the second semiconductor fins 116B. Then, the epitaxial source/drain regions 138 in the second region 100B are epitaxially grown in the recesses. The epitaxial source/drain regions 138 may include any acceptable material, such as appropriate for n-type FinFETs. For example, the epitaxial source/drain regions 138 in the second region 100B may include silicon, SiC, SiCP, SiP, or the like. The epitaxial source/drain regions 138 in the second region 100B may be formed of a material having a smaller lattice constant than the lattice constant of the first epitaxial layer 106, creating a tensile stress in the channel region to increase electron mobility for NMOS devices. The epitaxial source/drain regions 138 in the second region 100B may also have surfaces raised from respective surfaces of the second semiconductor fins 116B and may have facets.

The epitaxial source/drain regions 138 and/or the first semiconductor fins 116A and the second semiconductor fins 116B may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 138 may be in situ doped during growth.

As a result of the epitaxy processes used to form the epitaxial source/drain regions 138 in the first region 100A and the second region 100B, upper surfaces of the epitaxial source/drain regions 138 have facets which expand laterally outward beyond a sidewalls of the first semiconductor fins 116A and the second semiconductor fins 116B. In some embodiments, these facets cause adjacent source/drain regions 138 to merge as illustrated by FIG. 15C. In other embodiments, adjacent source/drain regions 138 remain separated after the epitaxy process is completed as illustrated by FIG. 15D. The epitaxial source/drain regions 138 formed in the first semiconductor fins 116A or the second semiconductor fins 116B may be merged, as illustrated in FIG. 15C, or separated, as illustrated in FIG. 15D.

Figure 15A:
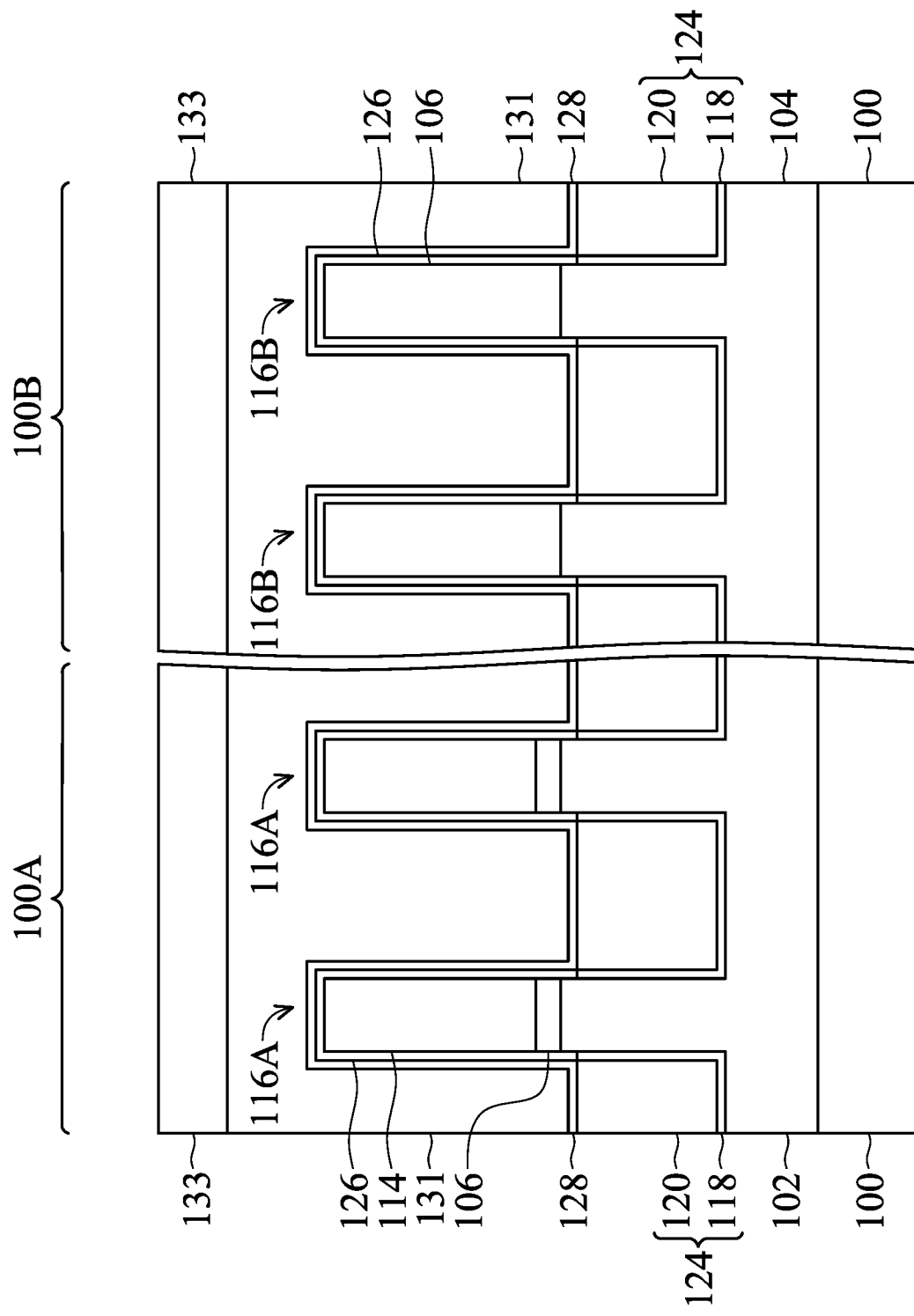
FIGS. 15A-15D illustrate cross-sectional views of a formation of epitaxial source/drain regions, in accordance with some embodiments.
Figure 15B:
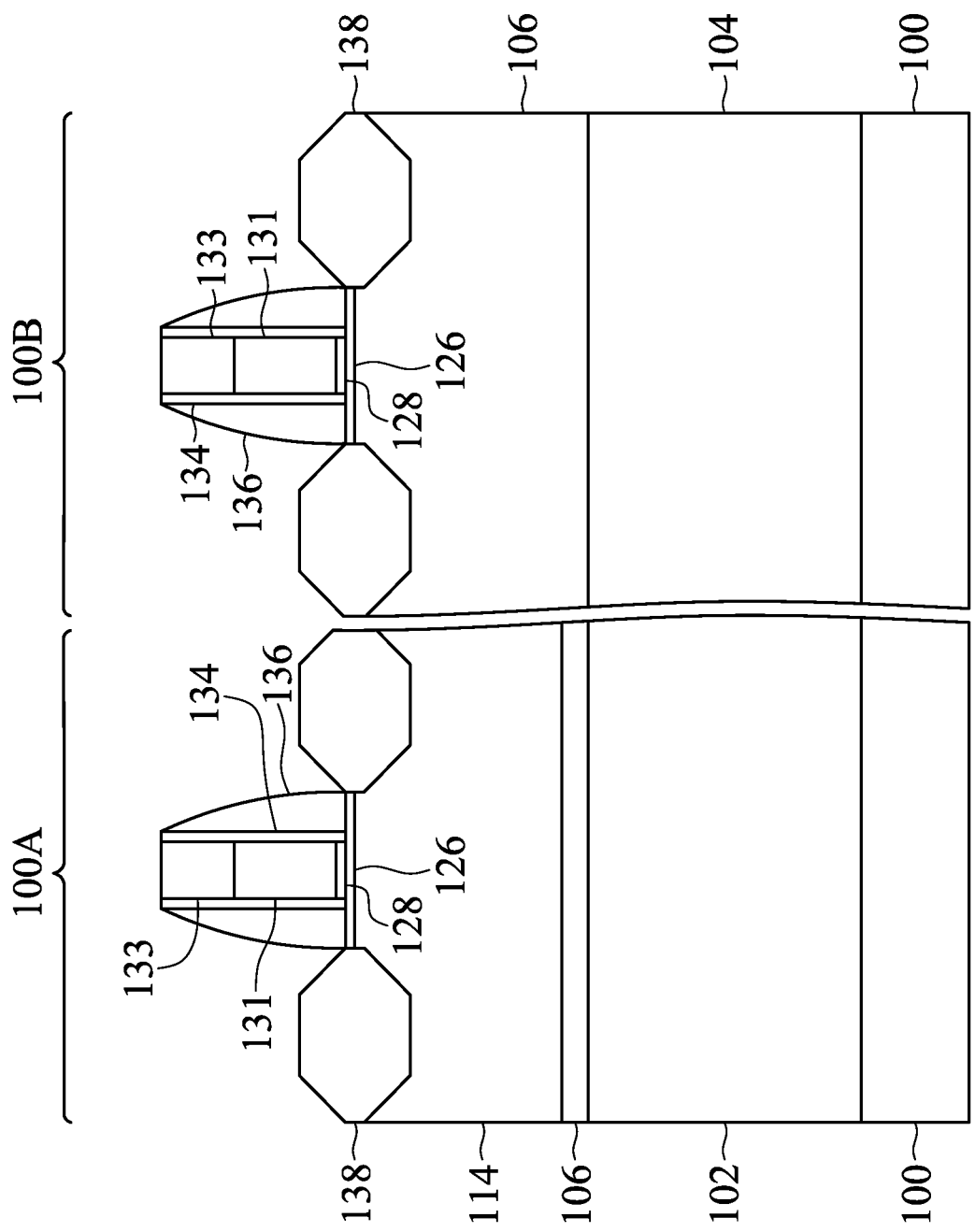
Figure 15D:
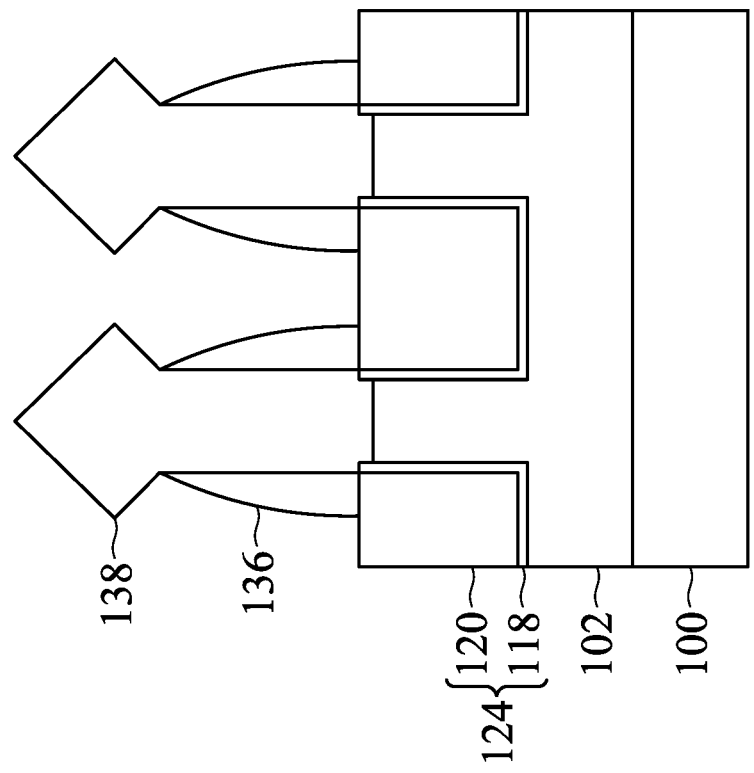
Figure 15C:
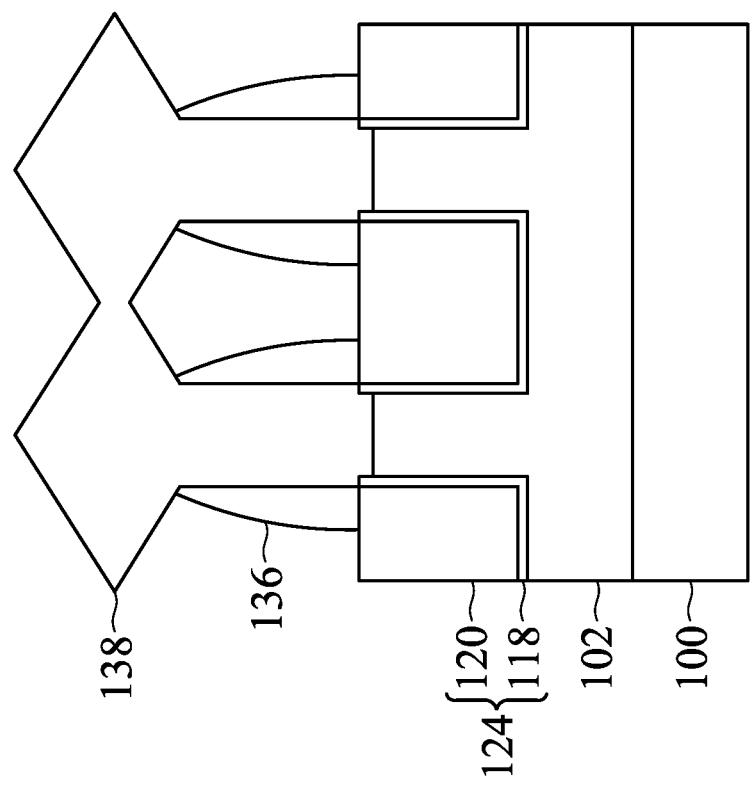
Figure 16A:
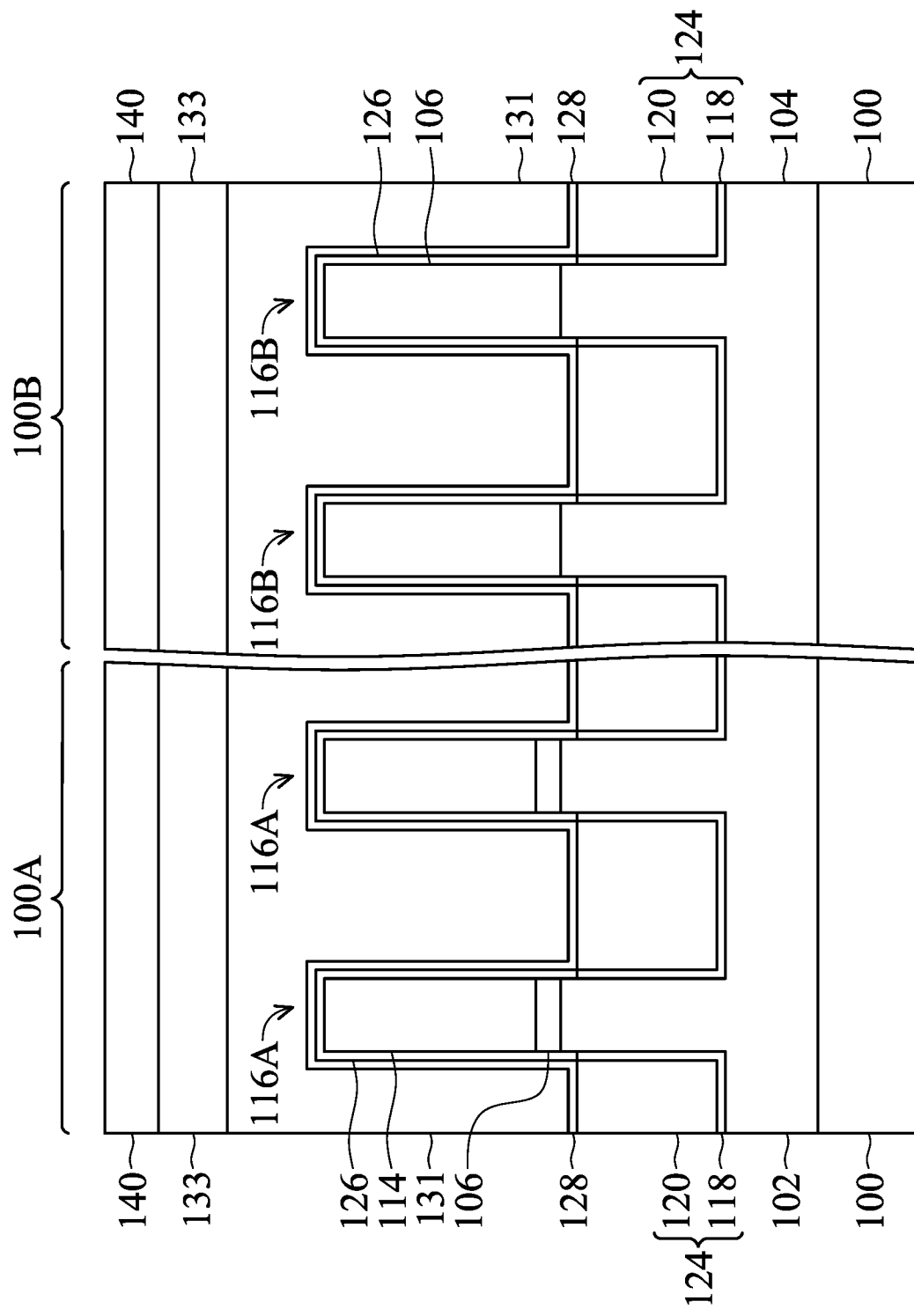
FIGS. 16A and 16B illustrate cross-sectional views of a formation of a first interlayer dielectric, in accordance with some embodiments.
Figure 16B:
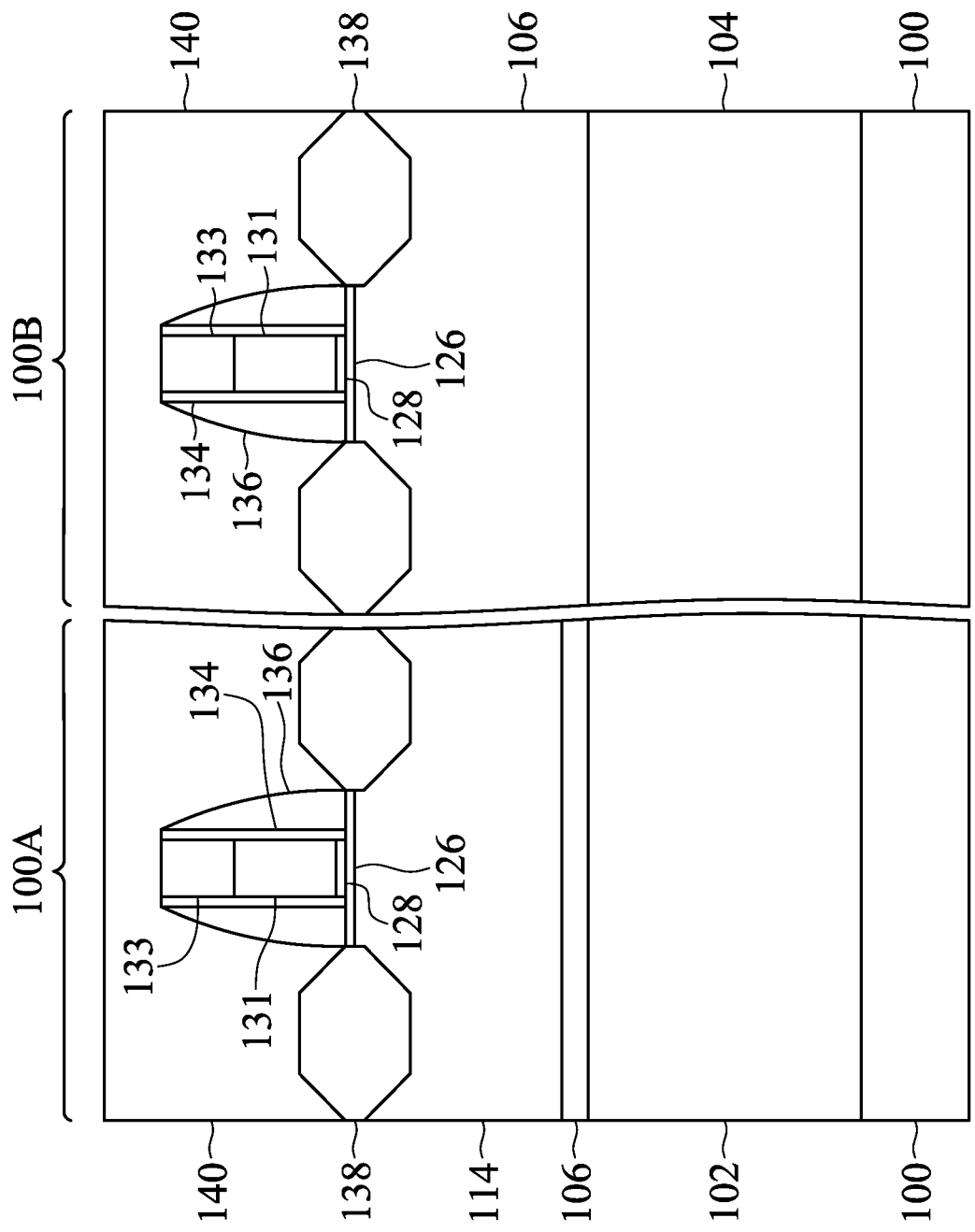

In FIGS. 16A and 16B, a first interlayer dielectric (ILD) 140 is deposited over the structure illustrated in FIGS. 15A and 15B. The first ILD 140 may be formed of a dielectric material or a semiconductor material, and may be deposited by any suitable method, such as CVD, plasma-enhanced CVD (PECVD), or flowable CVD (FCVD). Dielectric materials may include phosphosilicate glass (PSG), borosilicate glass (BSG), boron-doped phosphosilicate glass (BPSG), undoped silicate glass (USG), or the like. Semiconductor materials may include amorphous silicon (a-Si), silicon germanium ($Si_xGe_{1-x}$, where x may be between approximately 0 and 1), pure germanium, or the like. Other insulation or semiconductor materials formed by any acceptable process may be used. In some embodiments, a contact etch stop layer (CESL, not separately illustrated), is disposed between the first ILD 140 and the epitaxial source/drain regions 138, the masks 133, and the gate spacers 136.

Figure 17A:
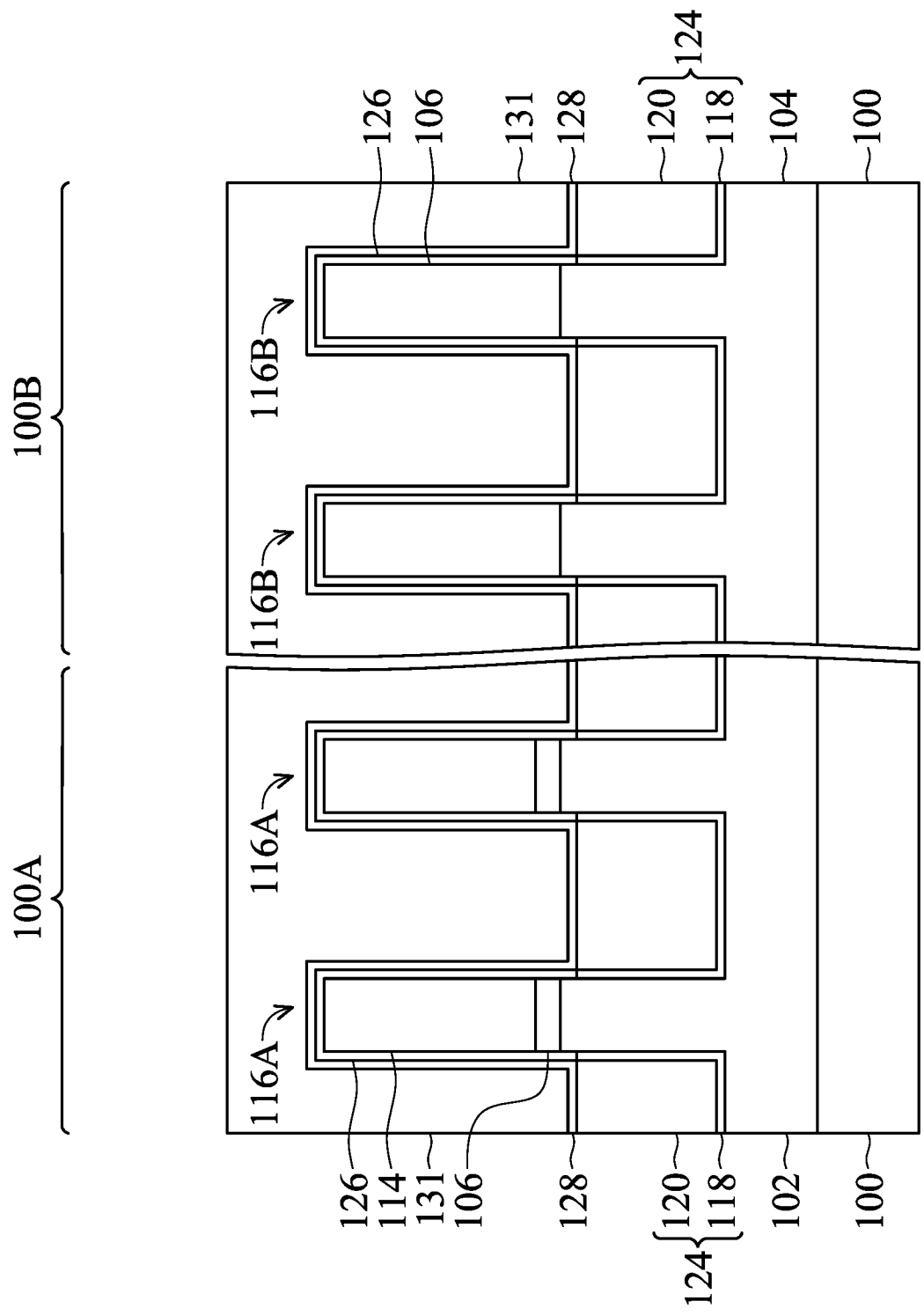
FIGS. 17A and 17B illustrate cross-sectional views of a planarization of the first interlayer dielectric, the masks, the gate seal spacers, and the gate spacers, in accordance with some embodiments.
Figure 17B:
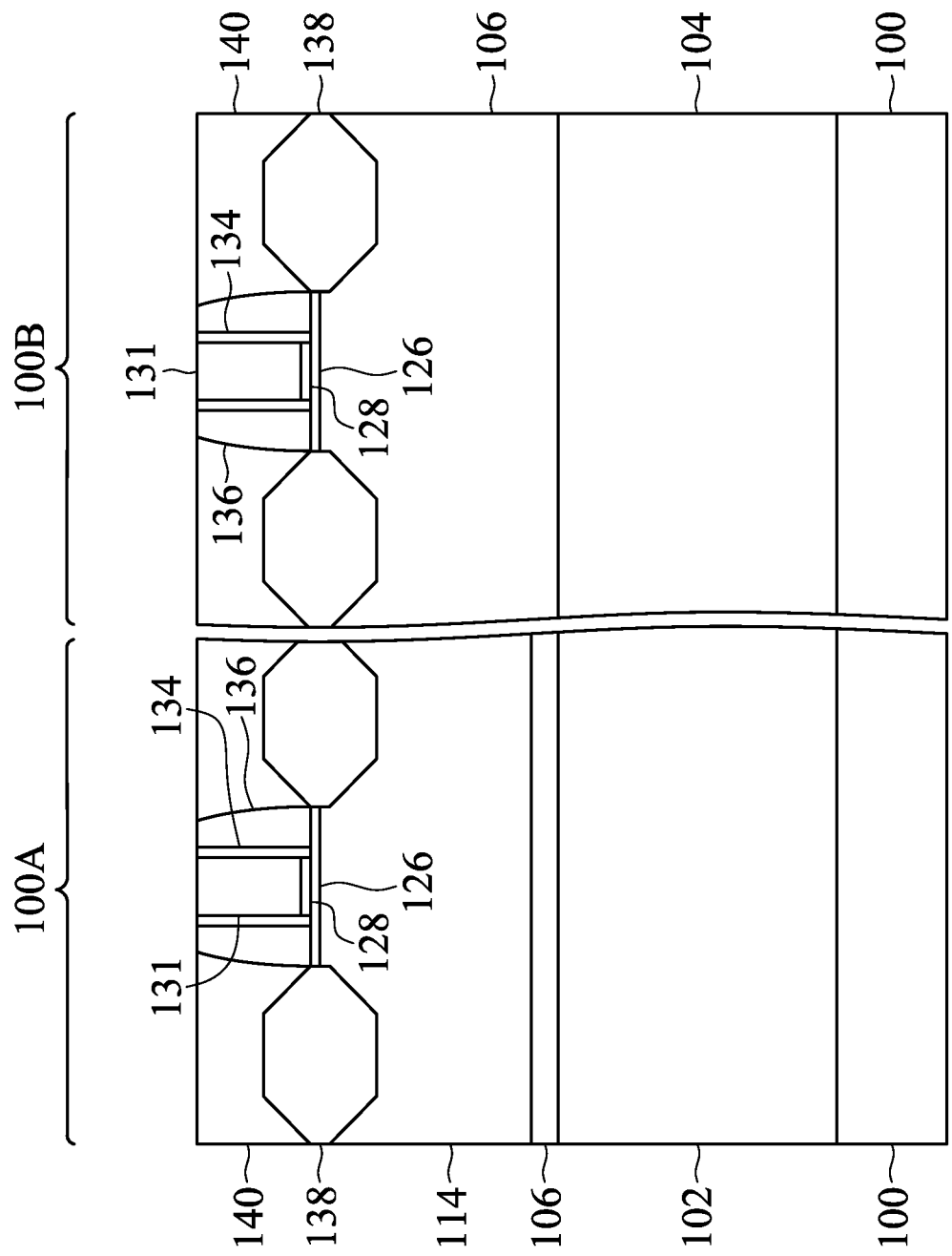

In FIGS. 17A and 17B, a planarization process, such as a CMP, may be performed to level the top surface of the first ILD 140 with the top surfaces of the dummy gates 131. The planarization process may also remove the masks 133 on the dummy gates 131, and portions of the gate seal spacers 134 and the gate spacers 136 along sidewalls of the masks 133. After the planarization process, top surfaces of the dummy gates 131, the gate seal spacers 134, the gate spacers 136, and the first ILD 140 are level. Accordingly, the top surfaces of the dummy gates 131 are exposed through the first ILD 140.

Figure 18A:
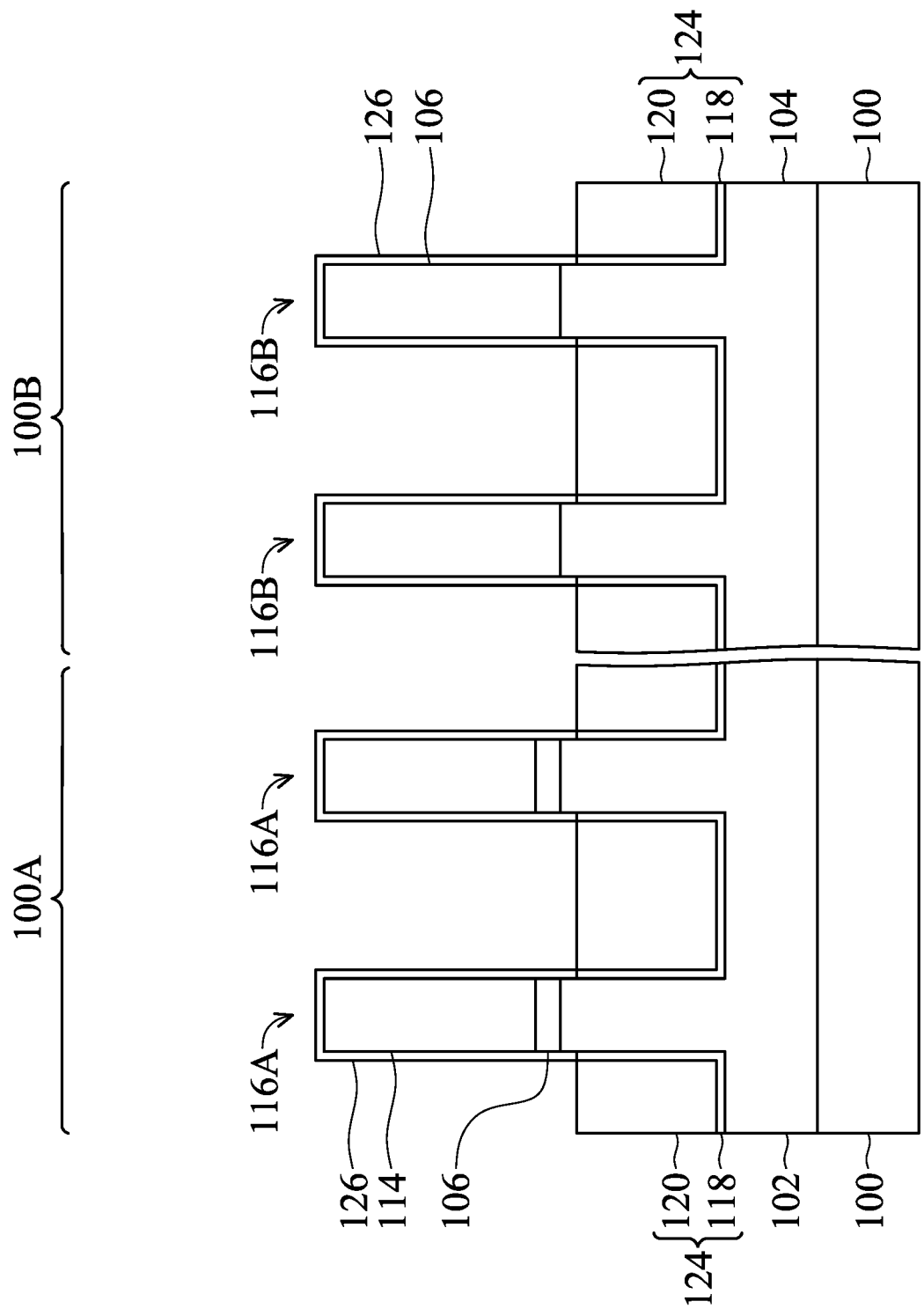
FIGS. 18A and 18B illustrate cross-sectional views of a removal of the dummy gates, in accordance with some embodiments.
Figure 18B:
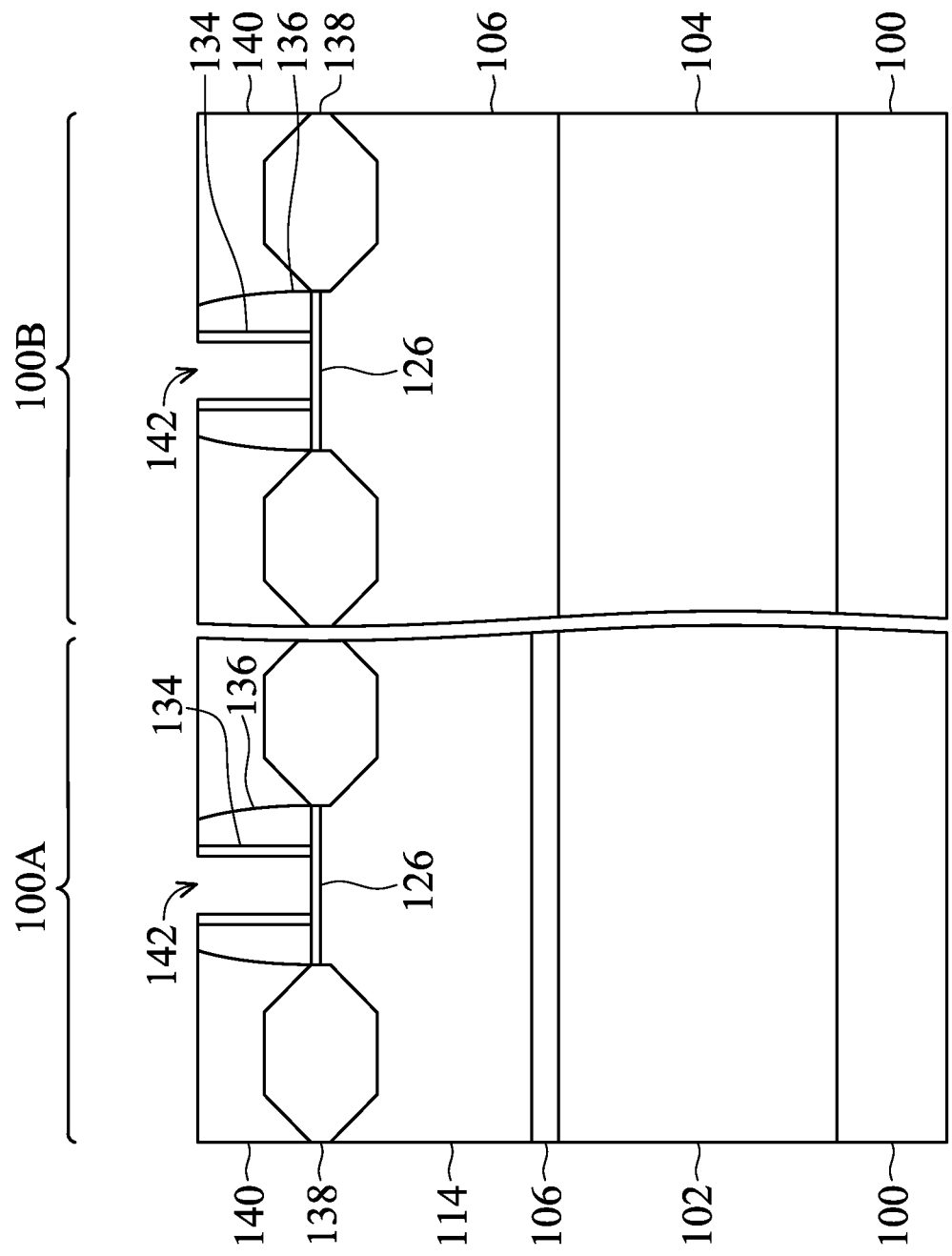

In FIGS. 18A and 18B, the dummy gates 131 and portions of the dummy dielectric layer 128 directly underlying the dummy gates 131 are removed in an etching step(s), so that recesses 142 are formed. In some embodiments, the dummy gates 131 are removed by an anisotropic dry etch process. For example, the etching process may include a dry etch process using reaction gas(es) that selectively etch the dummy gates 131 without etching the first ILD 140 or the gate spacers 136. Each recess 142 exposes a channel region of a respective first semiconductor fin 116A or second semiconductor fin 116B. Each channel region is disposed between neighboring pairs of the epitaxial source/drain regions 138. During the removal, the dummy dielectric layer 128 may be used as an etch stop layer when the dummy gates 131 are etched. The dummy dielectric layer 128 may then be removed after the removal of the dummy gates 131.

Figure 19A:
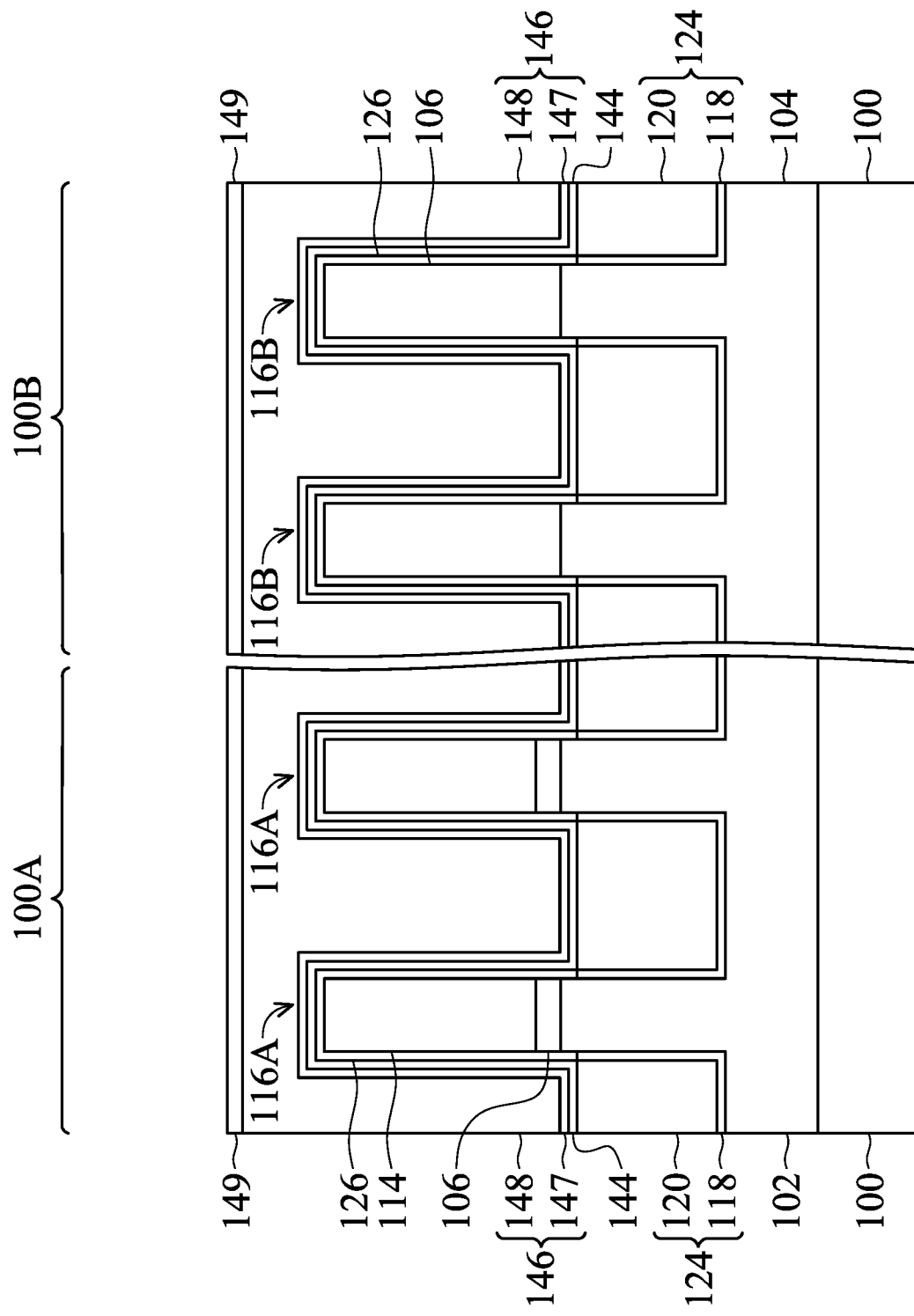
FIGS. 19A and 19B illustrate cross-sectional views of a formation of a gate dielectric layer, a work function layer, and gate electrodes, in accordance with some embodiments.
Figure 19B:
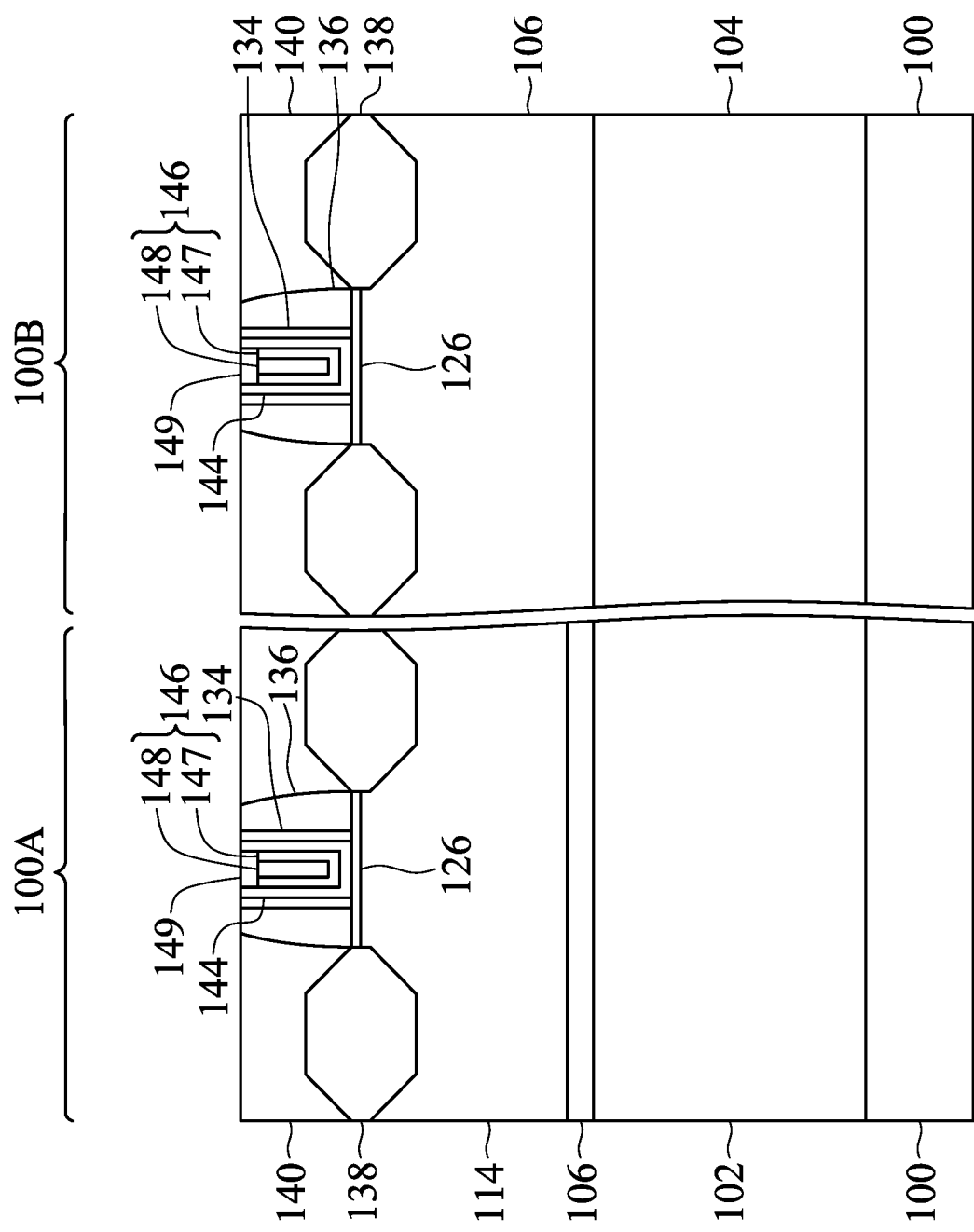

In FIGS. 19A and 19B, gate dielectric layers 144 and gate electrodes 146 are formed for replacement gates. The gate dielectric layers 144 are deposited conformally in the recesses 142, such as on the top surfaces and the sidewalls of the first semiconductor fins 116A and the second semiconductor fins 116B and on sidewalls of the gate seal spacers 134/gate spacers 136. The gate dielectric layers 144 may also be formed on the top surface of the first ILD 140. In accordance with some embodiments, the gate dielectric layers 144 comprise silicon oxide, silicon nitride, or multilayers thereof. In some embodiments, the gate dielectric layers 144 are a high-k dielectric material, and in these embodiments, the gate dielectric layers 144 may have a k value greater than about 7.0, and may include a metal oxide or a silicate of Hf, Al, Zr, La, Mg, Ba, Ti, Pb, and combinations thereof. The formation methods of the gate dielectric layers 144 may include molecular beam deposition (MBD), ALD, PECVD, and the like.

The gate electrodes 146 are deposited over the gate dielectric layers 144 and fill the remaining portions of the recesses 142. The gate electrodes 146 may be a metal-containing material such as TiN, TaN, TaC, Co, Ru, Al, combinations thereof, or multi-layers thereof. The gate electrodes 146 may include one or more layers of conductive material, such as a work function layer 147 and a fill material 148. After the filling of the gate electrodes 146, a planarization process, such as a CMP, may be performed to remove the excess portions of the gate dielectric layers 144 and the gate electrodes 146, which excess portions are over the top surface of the first ILD 140. The remaining portions of the gate electrodes 146 and the gate dielectric layers 144 thus form replacement gates of the resulting FinFETs. The gate electrodes 146 and the gate dielectric layers 144 may be collectively referred to as a "gate" or a "gate stack." The gate and the gate stacks may extend along sidewalls of a channel region of the first semiconductor fins 116A and the second semiconductor fins 116B.

The formation of the gate dielectric layers 144 in the first region 100A and the second region 100B may occur simultaneously such that the gate dielectric layers 144 in each region are formed from the same materials, and the formation of the gate electrodes 146 may occur simultaneously such that the gate electrodes 146 in each region are formed from the same materials. In some embodiments, the gate dielectric layers 144 in each region may be formed by distinct processes, such that the gate dielectric layers 144 may be different materials, and/or the gate electrodes 146 in each region may be formed by distinct processes, such that the gate electrodes 146 may be different materials. Various masking steps may be used to mask and expose appropriate regions when using distinct processes.

FIGS. 19A and 19B further illustrate the formation of self-aligned contacts (SACs) 149 on each of the gate electrodes 146. After the formation of the gate electrodes 146, portions of the gate electrodes 146, such as the top portions of the work function layer 147 and the fill material 148, are removed using one or more etch processes. In some embodiments, top portions of the gate dielectric layers 144 may also be removed by the one or more etch processes. Upon removal of the top portion of the gate electrodes 146, recesses are formed between the gate dielectric layers 144. The SACs 149 are then formed in the recesses where the top portions of the gate electrodes 146 were removed. The SACs 149 protect the gate electrodes 146 during a subsequent formation of openings, which are configured to accommodate subsequently formed contacts (described below with respect to FIGS. 21A and 22B). The SACs 149 may include or be an insulating material, such as silicon oxide, silicon nitride, silicon oxynitride, silicon carbon oxynitride, silicon carbon nitride, any suitable dielectric material, or any combination thereof. In some embodiments, the SACs 149 are silicon carbon oxynitride. The SACs 149 may be formed by a CVD, PVD, ALD, any suitable deposition technique, or a combination thereof, and subsequent planarization, such as a CMP.

Figure 20A:
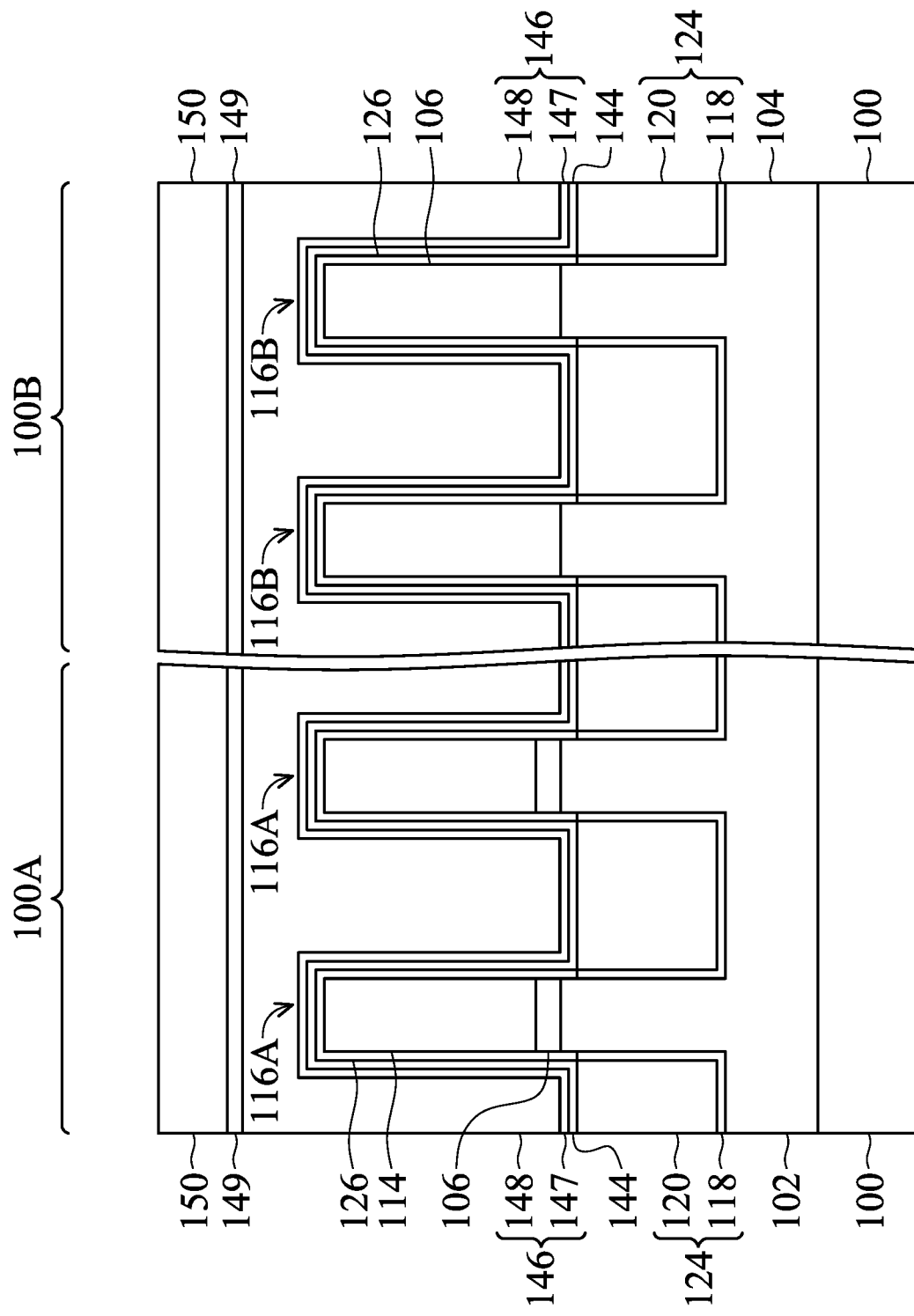
FIGS. 20A and 20B illustrate cross-sectional views of a formation of a second interlayer dielectric, in accordance with some embodiments.
Figure 20B:
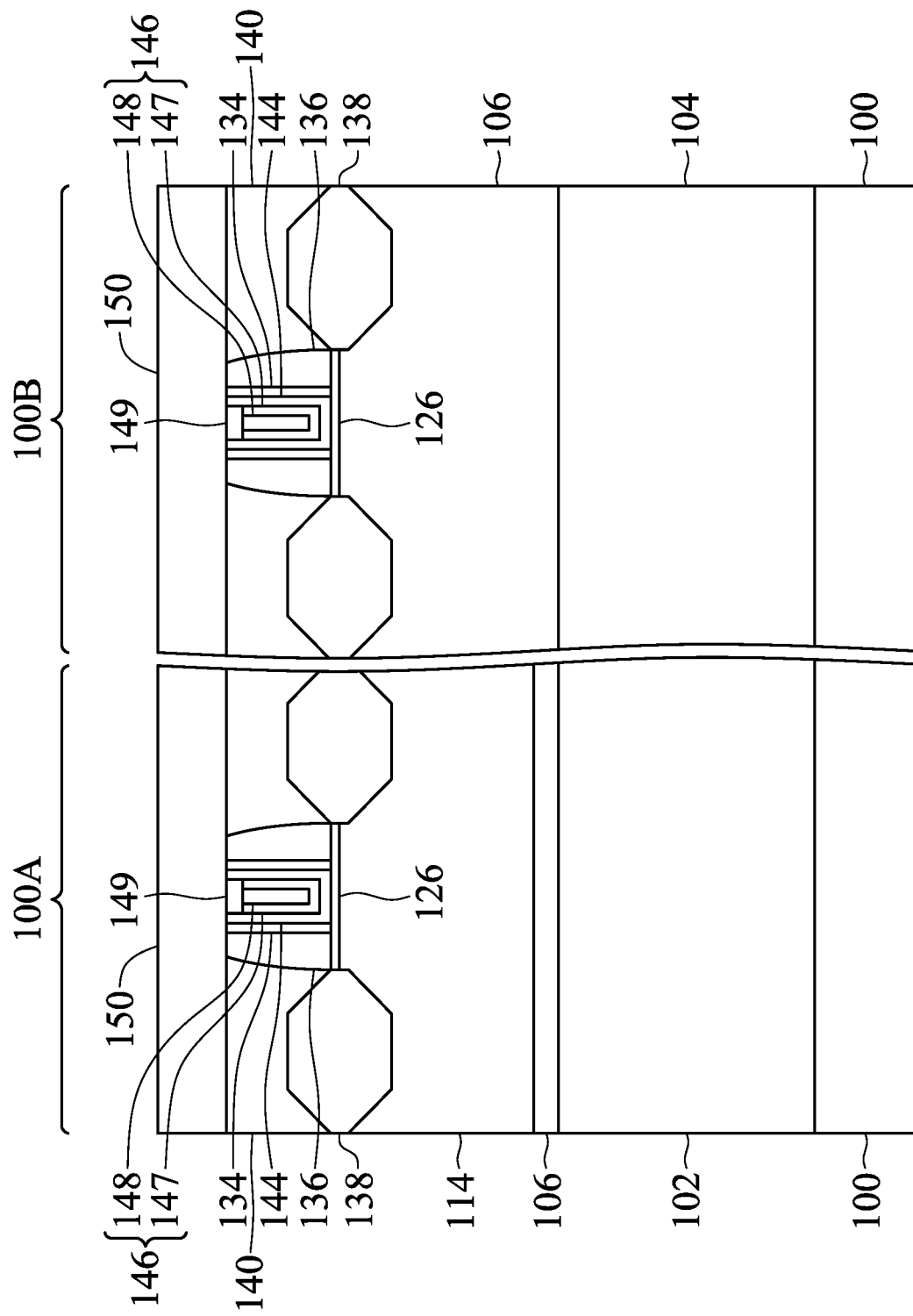

In FIGS. 20A and 20B, a second ILD 150 is deposited over the first ILD 140. In an embodiment, the second ILD 150 is a flowable film formed by a flowable CVD method. In some embodiments, the second ILD 150 is formed of a dielectric material such as PSG, BSG, BPSG, USG, or the like, and may be deposited by any suitable method, such as CVD and PECVD.

Figure 21A:
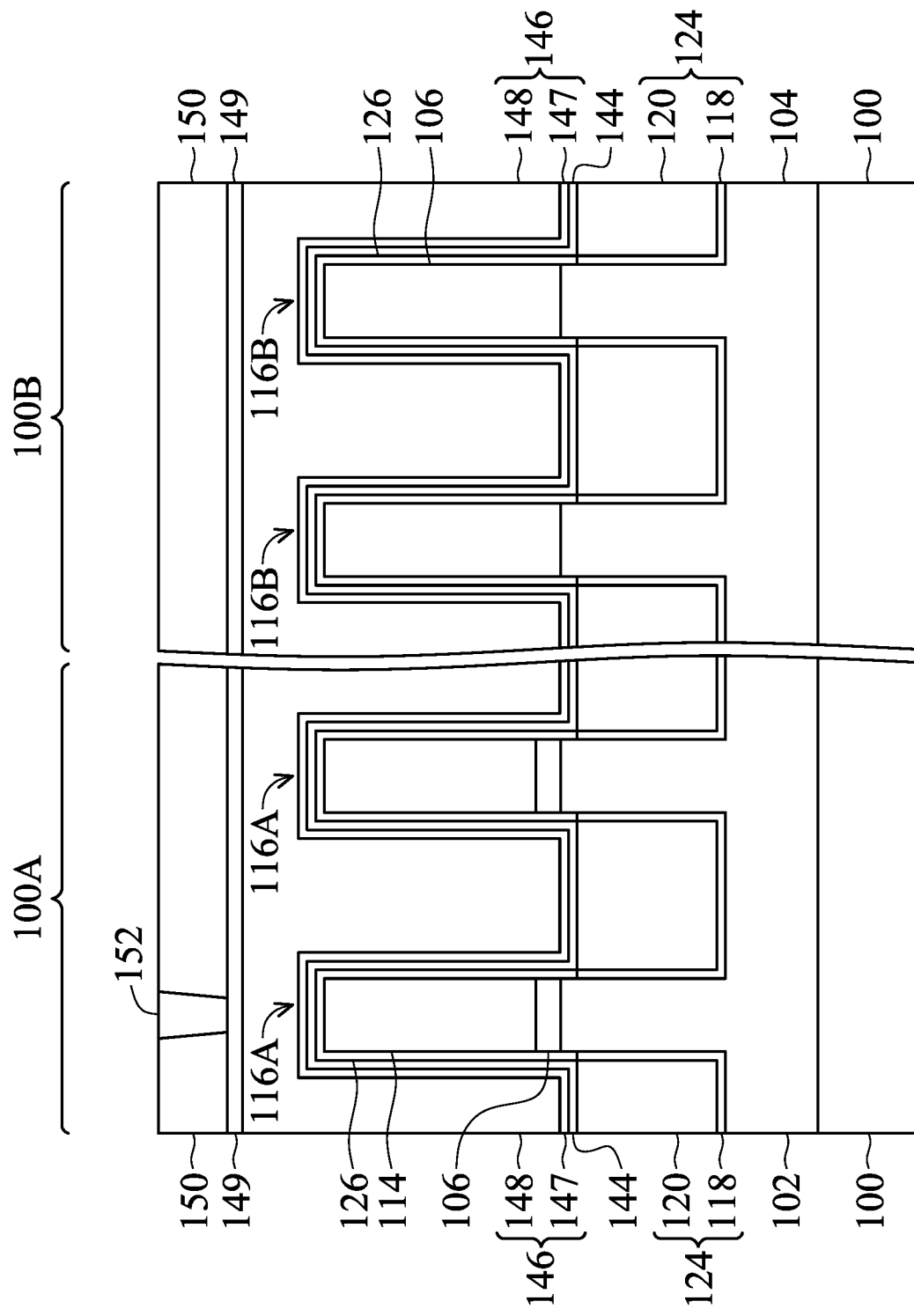
FIGS. 21A and 21B illustrate cross-sectional views of a formation of a gate contact and source/drain contacts, in accordance with some embodiments.
Figure 21B:
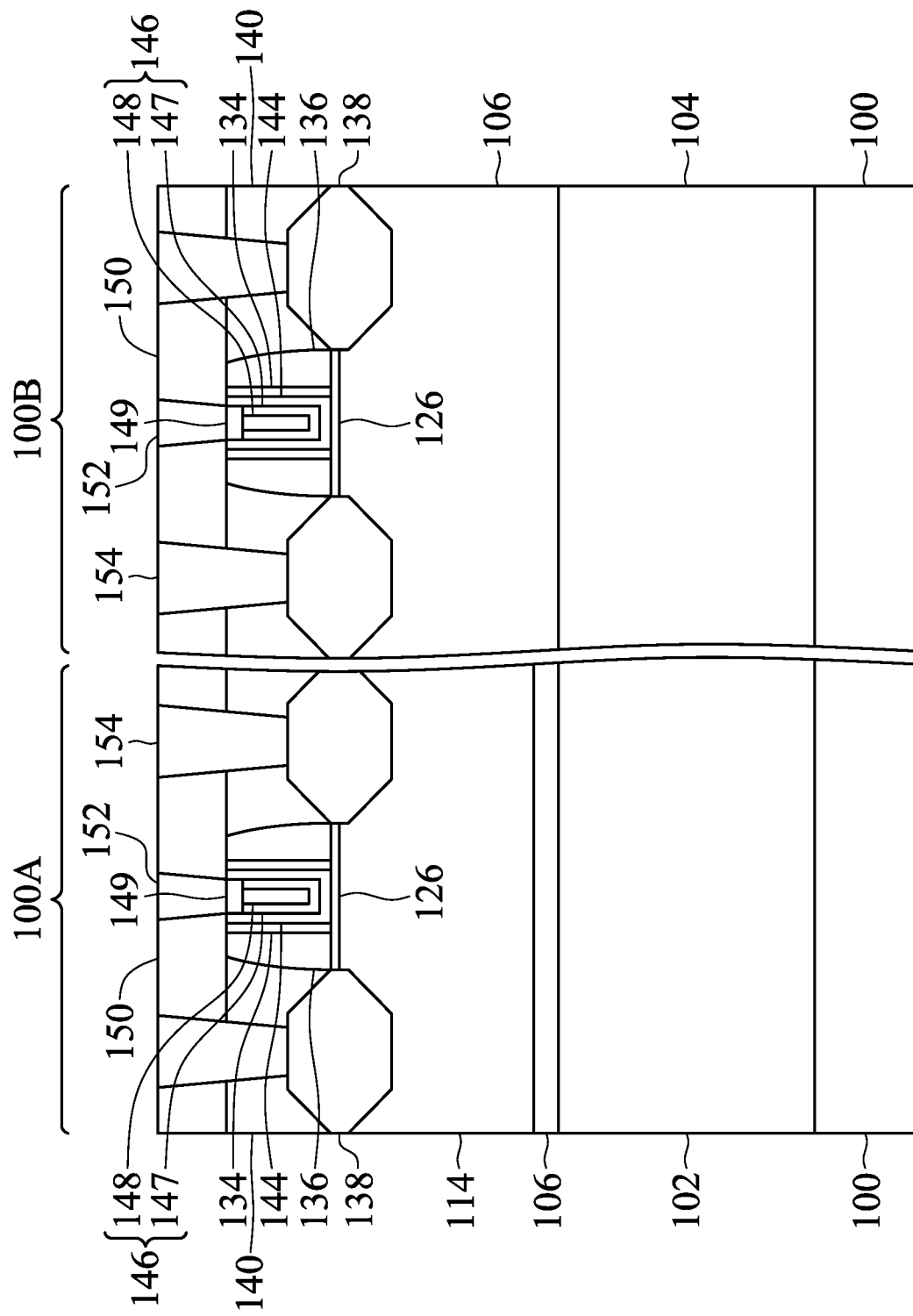

In FIGS. 21A and 21B, a gate contact 152 and source/drain contacts 154 are formed through the second ILD 150 and the first ILD 140. Openings for the source/drain contacts 154 (not separately illustrated) are formed through the second ILD 150 and the first ILD 140, and openings for the gate contact 152 (not separately illustrated) are formed through the second ILD 150. The openings may be formed using acceptable photolithography and etching techniques. Optionally, prior to formation of the gate contact 152 and the source/drain contacts 154, a silicide contact (not separately illustrated) may be formed. The silicide contact may comprise titanium, nickel, cobalt, or erbium, and may be used to reduce the Schottky barrier height of the gate contact 152 and the source/drain contacts 154. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process.

The gate contact 152 and the source/drain contacts 154 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 152 and the source/drain contacts 154 may be deposited into the openings in the second ILD 150 and the first ILD 140 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 152 is physically and electrically connected to the gate electrode 146, and the source/drain contacts 154 are physically and electrically connected to the epitaxial source/drain regions 138. FIGS. 21A and 21B illustrate the gate contact 152 and the source/drain contacts 154 in a same cross-section; however, in other embodiments, the gate contact 152 and the source/drain contacts 154 may be disposed in different cross-sections. Further, the position of the gate contact 152 and the source/drain contacts 154 in FIGS. 21A and 21B are merely illustrative and not intended to be limiting in any way. For example, the gate contact 152 may be vertically aligned with one of the first semiconductor fins 116A as illustrated or may be disposed at a different location on the gate electrode 146. Furthermore, the source/drain contacts 154 may be formed prior to, simultaneously with, or after forming the gate contacts 152.

As discussed above, including the second epitaxial layer 114 of a silicon germanium material in the first semiconductor fins 116A provides a p-type fully strained channel with lower channel resistance, highly efficient mobility, improved Ion/Ioff performance, and improved DIBL. Moreover, forming the cap layer 126 according to the processes described above prevents germanium from out-diffusing from the first semiconductor fins 116A and this, in turn, reduces iso-dense loading effects, reduces the formation of small wings in the first semiconductor fins 116A, reduces the wiggle effect in the first semiconductor fins 116A, and reduces the LER of the first semiconductor fins 116A. As such, semiconductor devices formed according to the above-described methods have improved performance.

In accordance with an embodiment, a method includes epitaxially growing a first semiconductor layer over an N-well; etching the first semiconductor layer to form a first recess; epitaxially growing a second semiconductor layer filling the first recess; etching the second semiconductor layer, the first semiconductor layer, and the N-well to form a first fin; forming a shallow trench isolation region adjacent the first fin; and forming a cap layer over the first fin, the cap layer contacting the second semiconductor layer, forming the cap layer including performing a pre-clean process to remove a native oxide from exposed surfaces of the second semiconductor layer; performing a sublimation process to produce a first precursor; and performing a deposition process wherein material from the first precursor is deposited on the second semiconductor layer to form the cap layer. In an embodiment, the first semiconductor layer includes silicon, the second semiconductor layer includes silicon germanium, and the cap layer includes silicon. In an embodiment, the pre-clean process is performed in situ using HF or $NH_3$. In an embodiment, the sublimation process is performed at a temperature of between 50° C. and 300° C. In an embodiment, the first precursor includes silane ($SiH_4$), disilane ($Si_2H_6$), or dichlorosilane ($SiH_2Cl_2$). In an embodiment, the deposition process is performed at a temperature of between 200° C. and 450° C. In an embodiment, during the deposition process, hydrogen gas is flowed over the first fin at a flow rate of between 0.2 slm and 5 slm.

In accordance with another embodiment, a method includes forming an N-well and a P-well over a substrate; forming a first semiconductor layer over the N-well and the P-well, the first semiconductor layer including a first semiconductor material; etching the first semiconductor layer to form a first recess over the N-well; forming a second semiconductor layer in the first recess, the second semiconductor layer including a second semiconductor material; etching the first semiconductor layer and the second semiconductor layer to form a first fin over the N-well and a second fin over the P-well, the first fin including the second semiconductor layer, the second fin including the first semiconductor layer; and forming a cap layer over the first fin and the second fin, the cap layer including a third semiconductor material, forming the cap layer including removing a native oxide from the second semiconductor layer; sublimating a sample to produce a precursor gas; and depositing the cap layer over the first fin and the second fin from the precursor gas. In an embodiment, the first semiconductor material has a first lattice constant, the second semiconductor material has a second lattice constant greater than the first lattice constant, and the third semiconductor material has a third lattice constant less than the second lattice constant. In an embodiment, the method further includes planarizing the first semiconductor layer and the second semiconductor layer such that a topmost surface of the first semiconductor layer is level with a topmost surface of the second semiconductor layer. In an embodiment, at least a portion of the first semiconductor layer remains over the N-well after etching the first semiconductor layer to form the first recess, and the first fin further includes the first semiconductor layer. In an embodiment, the method further includes forming shallow trench isolation (STI) regions adjacent the first fin and the second fin before forming the cap layer, the cap layer being formed on exposed portions of the first fin and the second fin. In an embodiment, the sample is sublimated at a temperature of between 50° C. and 300° C. and the cap layer is deposited at a temperature of between 200° C. and 400° C.

In accordance with yet another embodiment, a semiconductor device includes a first semiconductor fin, the first semiconductor fin including an N-well; a first semiconductor layer over the N-well; a second semiconductor layer over the first semiconductor layer; a cap layer over and in contact with a top surface and sidewalls of the second semiconductor layer, the cap layer including a polycrystalline material, the first semiconductor layer and the second semiconductor layer including monocrystalline materials; and an intermix layer disposed between the second semiconductor layer and the cap layer, the intermix layer including a material of the second semiconductor layer and a material of the cap layer, the intermix layer having a thickness of between 0.5 Å and 20 Å. In an embodiment, the first semiconductor layer includes silicon, the second semiconductor layer includes silicon germanium, and the cap layer includes silicon. In an embodiment, the intermix layer has a germanium concentration gradient which increases in a direction from the cap layer to the second semiconductor layer. In an embodiment, the semiconductor device further includes a shallow trench isolation (STI) region adjacent the first semiconductor fin, the STI region contacting the N-well, the cap layer being disposed on the STI region. In an embodiment, the cap layer has a thickness of between 0.2 Å and 10 Å. In an embodiment, the semiconductor device further includes a second semiconductor fin, the second semiconductor fin including a P-well; and a third semiconductor layer over the P-well, the third semiconductor layer comprising silicon, an uppermost surface of the third semiconductor layer being level with an uppermost surface of the second semiconductor layer, and a lowermost surface of the third semiconductor layer being level with a lowermost surface of the first semiconductor layer. In an embodiment, the cap layer further contacts sidewalls of the first semiconductor layer and the N-well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   epitaxially growing a first semiconductor layer over an N-well;
   etching the first semiconductor layer to form a first recess;
   epitaxially growing a second semiconductor layer filling the first recess;
   etching the second semiconductor layer, the first semiconductor layer, and the N-well to form a first fin;
   forming a shallow trench isolation region adjacent the first fin; and
   forming a cap layer over the first fin, wherein the cap layer contacts the second semiconductor layer, wherein forming the cap layer comprises:
      performing a pre-clean process to remove a native oxide from exposed surfaces of the second semiconductor layer;
      performing a sublimation process to produce a first precursor; and
      performing a deposition process wherein material from the first precursor is deposited on the second semiconductor layer to form the cap layer.

2. The method of claim 1, wherein the first semiconductor layer comprises silicon, the second semiconductor layer comprises silicon germanium, and the cap layer comprises silicon.

3. The method of claim 1, wherein the pre-clean process is performed in situ using HF or $NH_3$.

4. The method of claim 1, wherein the sublimation process is performed at a temperature of between 50° C. and 300° C.

5. The method of claim 1, wherein the first precursor comprises silane ($SiH_4$), disilane ($Si_2H_6$), or dichlorosilane ($SiH_2Cl_2$).

6. The method of claim 1, wherein the deposition process is performed at a temperature of between 200° C. and 450° C.

7. The method of claim 1, wherein during the deposition process, hydrogen gas is flowed over the first fin at a flow rate of between 0.2 slm and 5 slm.

8. A method comprising:
   forming an N-well and a P-well over a substrate;
   forming a first semiconductor layer over the N-well and the P-well, the first semiconductor layer comprising a first semiconductor material;
   etching the first semiconductor layer to form a first recess over the N-well;
   forming a second semiconductor layer in the first recess, the second semiconductor layer comprising a second semiconductor material;
   etching the first semiconductor layer and the second semiconductor layer to form a first fin over the N-well and a second fin over the P-well, the first fin comprising the second semiconductor layer, the second fin comprising the first semiconductor layer; and
   forming a cap layer over the first fin and the second fin, the cap layer comprising a third semiconductor material, wherein forming the cap layer comprises:
      removing a native oxide from the second semiconductor layer;
      sublimating a sample to produce a precursor gas; and
      depositing the cap layer over the first fin and the second fin from the precursor gas.

9. The method of claim 8, wherein the first semiconductor material has a first lattice constant, wherein the second semiconductor material has a second lattice constant greater than the first lattice constant, and wherein the third semiconductor material has a third lattice constant less than the second lattice constant.

10. The method of claim 8, further comprising planarizing the first semiconductor layer and the second semiconductor layer such that a topmost surface of the first semiconductor layer is level with a topmost surface of the second semiconductor layer.

11. The method of claim 8, wherein at least a portion of the first semiconductor layer remains over the N-well after etching the first semiconductor layer to form the first recess, and wherein the first fin further comprises the first semiconductor layer.

12. The method of claim 8, further comprising forming shallow trench isolation (STI) regions adjacent the first fin and the second fin before forming the cap layer, wherein the cap layer is formed on exposed portions of the first fin and the second fin.

13. The method of claim 8, wherein the sample is sublimated at a temperature of between 50° C. and 300° C. and the cap layer is deposited at a temperature of between 200° C. and 400° C.

14. A semiconductor device comprising:
   a first semiconductor fin, the first semiconductor fin comprising:
      an N-well;
      a first semiconductor layer over the N-well;
      a second semiconductor layer over the first semiconductor layer;
      a cap layer over and in contact with a top surface and sidewalls of the second semiconductor layer, the cap layer comprising a polycrystalline material, the first semiconductor layer and the second semiconductor layer comprising monocrystalline materials; and
      an intermix layer disposed between the second semiconductor layer and the cap layer, the intermix layer comprising a material of the second semiconductor layer and a material of the cap layer, the intermix layer having a thickness of between 0.5 Å and 20 Å.

15. The semiconductor device of claim 14, wherein the first semiconductor layer comprises silicon, wherein the second semiconductor layer comprises silicon germanium, wherein the cap layer comprises silicon.

16. The semiconductor device of claim 15, wherein the intermix layer has a germanium concentration gradient which increases in a direction from the cap layer to the second semiconductor layer.

17. The semiconductor device of claim 14, further comprising a shallow trench isolation (STI) region adjacent the first semiconductor fin, the STI region contacting the N-well, wherein the cap layer is disposed on the STI region.

18. The semiconductor device of claim 14, wherein the cap layer has a thickness of between 0.2 Å and 10 Å.

19. The semiconductor device of claim 14, further comprising a second semiconductor fin, the second semiconductor fin comprising:
   a P-well; and
   a third semiconductor layer over the P-well, the third semiconductor layer comprising silicon, wherein an uppermost surface of the third semiconductor layer is level with an uppermost surface of the second semiconductor layer, and wherein a lowermost surface of the third semiconductor layer is level with a lowermost surface of the first semiconductor layer.

20. The semiconductor device of claim 14, wherein the cap layer further contacts sidewalls of the first semiconductor layer and the N-well.

\* \* \* \* \*